(12) United States Patent
Cho et al.

(10) Patent No.: US 10,516,204 B2
(45) Date of Patent: Dec. 24, 2019

(54) ELECTRONIC DEVICE INCLUDING SUPPORT MEMBER HAVING ANTENNA RADIATOR

(71) Applicant: Samsung Electronics Co., Ltd., Gyeonggi-do (KR)

(72) Inventors: Bumjin Cho, Gyeonggi-do (KR); Yong-Youn Kim, Gyeonggi-do (KR); Soon Park, Gyeonggi-do (KR); Kyu-Hyuck Kwak, Gyeonggi-do (KR); Han-Jib Kim, Gyeonggi-do (KR); Hyo-Seok Na, Gyeonggi-do (KR); Chi-Hyun Cho, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/902,035

(22) Filed: Feb. 22, 2018

(65) Prior Publication Data
US 2018/0241115 A1 Aug. 23, 2018

(30) Foreign Application Priority Data

Feb. 23, 2017 (KR) .......................... 10-2017-0023960

(51) Int. Cl.
*H01Q 1/24* (2006.01)
*H04M 1/02* (2006.01)
(Continued)

(52) U.S. Cl.
CPC .............. *H01Q 1/243* (2013.01); *H01Q 1/36* (2013.01); *H01Q 1/38* (2013.01); *H01Q 21/061* (2013.01);
(Continued)

(58) Field of Classification Search
CPC .......... H01Q 1/24; H01Q 1/241; H01Q 1/243; H01Q 1/36; H01Q 1/38; H01Q 1/2291; H01Q 21/061; H01Q 21/08
See application file for complete search history.

(56) References Cited

U.S. PATENT DOCUMENTS

2011/0136447 A1   6/2011   Pascolini et al.
2014/0063719 A1*  3/2014   Yamazaki ............. G06F 1/1601
                                                361/679.21
(Continued)

*Primary Examiner* — Hoang V Nguyen
(74) *Attorney, Agent, or Firm* — Cha & Reiter, LLC

(57) ABSTRACT

An embodiment disclosed herein relate to an electronic device including a support member on which an antenna radiator is formed. The electronic device may include: a housing including a first face facing in a first direction, a second face facing in a second direction opposite the first direction, a side face facing in a third direction that is perpendicular to both the first and second directions and surrounding at least a part of a space between the first and second faces; a display including a first region disposed in at least a part of the first face and at least one second region extending from the first region, the at least one second region disposed in at least a part of the side face of the housing; a support member disposed in a partial region of the space along the side face and configured to support the at least one second region; a bracket disposed on another partial region of the space and configured to support the display; and at least one antenna radiator disposed on the support member.

19 Claims, 28 Drawing Sheets

(51) Int. Cl.
*H05K 5/00* (2006.01)
*H01Q 1/38* (2006.01)
*H05K 5/03* (2006.01)
*H05K 5/02* (2006.01)
*H01Q 1/36* (2006.01)
*H01Q 21/06* (2006.01)
*H01Q 21/08* (2006.01)
*H01Q 1/22* (2006.01)

(52) U.S. Cl.
CPC .......... *H01Q 21/08* (2013.01); *H04M 1/0266* (2013.01); *H05K 5/0017* (2013.01); *H05K 5/0217* (2013.01); *H05K 5/03* (2013.01); *H01Q 1/2291* (2013.01); *H04M 1/0268* (2013.01)

(56) References Cited

U.S. PATENT DOCUMENTS

| | | | |
|---|---|---|---|
| 2016/0116941 A1* | 4/2016 | Kuwabara | G06F 1/163 361/679.03 |
| 2016/0233573 A1* | 8/2016 | Son | H04M 1/0202 |
| 2016/0299527 A1* | 10/2016 | Kwak | G06F 1/1626 |

* cited by examiner

ELECTRONIC DEVICE INCLUDING SUPPORT MEMBER HAVING ANTENNA RADIATOR

CROSS-REFERENCE TO RELATED APPLICATION(S)

This application is based on and claims priority under 35 U.S.C. § 119 to Korean Patent Application No. 10-2017-0023960, filed on Feb. 23, 2017, in the Korean Intellectual Property Office, the disclosure of which is incorporated by reference herein in its entirety.

TECHNICAL FIELD

Various embodiments disclosed herein generally relate to an electronic device having a support member where an antenna radiator is mounted.

BACKGROUND

The above information is presented as background information only to assist with the understanding of the present disclosure. No determination has been made, and no assertion is made, as to whether any of the above might be applicable as prior art with regard to the present disclosure.

In general, a housing of an electronic device may have one or more antenna devices mounted on the upper end region or the lower end region thereof. Further, in the electronic device, metal frames on the peripheral edge of the electronic device may be utilized as antenna radiators.

For example, the antenna radiators mounted on the housing may be used as a first Wi-Fi, a second Wi-Fi, Bluetooth, NFC, wireless charging, MST, and/or GPS antennas, etc.

SUMMARY

However, since mounting space within an electronic device is limited, difficulties may arise when mounting a multitude of antennas within the electronic device.

Various embodiments of the present disclosure provide an electronic device, in which at least one antenna radiator can be mounted on a support member that supports a curved display.

Various embodiments of the present disclosure provide an electronic device in which at least one curved display is disposed in the edge region of a flat display, and at least one antenna radiator can be mounted on a support member that is used to fix the curved display in place.

Various embodiments of the present disclosure provide an electronic device that can improve antenna performance.

In accordance with various embodiments of the present disclosure, an electronic device may include: a housing including a first face facing in a first direction, a second face facing in a second direction opposite the first direction, a side face facing in a third direction that is perpendicular to both the first and second directions and surrounding at least a part of a space between the first and second faces; a display including a first region disposed in at least a part of the first face and at least one second region extending from the first region, the at least one second region disposed in at least a part of the side face of the housing; a support member disposed in a partial region of the space along the side face and configured to support the at least one second region; a bracket disposed on another partial region of the space and configured to support the display; and at least one antenna radiator disposed on the support member.

In accordance with various embodiments of the present disclosure, an electronic device may include: a display extending from one face of the electronic device to another face of the electronic device, wherein a portion of the display in the other face of the electronic device is curved; a support member disposed on at least a part of the other face so as to support the portion of the display in the other face; and a conductive member formed on at least a part of the support member, and configured to receive a radio signal.

Various embodiments of the present disclosure enable a plurality of antenna radiators to be disposed on a support member that support a curved display, which is advantageous because it allows for the electronic device to be slimmer and enables mounting a plurality of antennas for various bands in the electronic device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
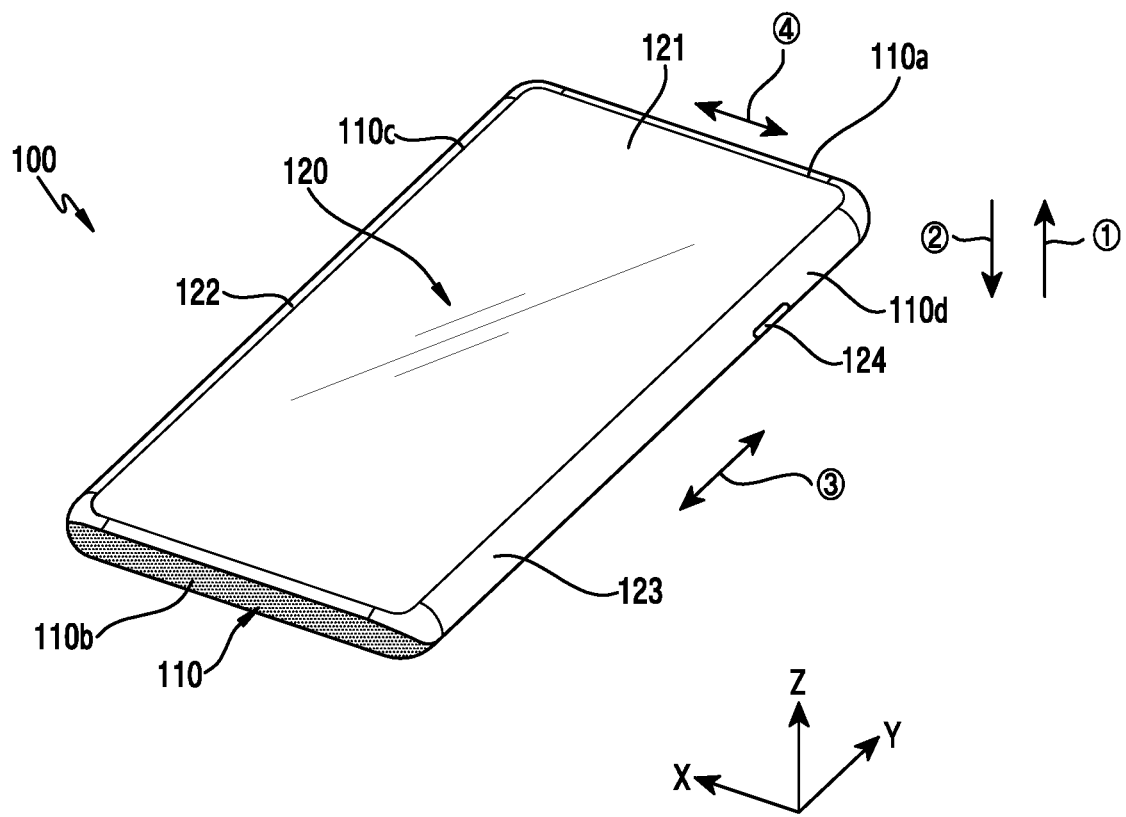
FIG. 1A is a perspective view illustrating the front side of an electronic device according to an embodiments of the present disclosure, and FIG. 1B(a), FIG. 1B(b), FIG. 1B(c), FIG. 1B(d) and FIG. 1B(e) respectively illustrate a front view, a rear view, a top view, a bottom view, and a left side view of the electronic device according to an embodiment of the present disclosure.

Hereinafter, various embodiments of the present disclosure will be described with reference to accompanying drawings. However, various embodiments of the present disclosure are not limited to specific embodiments, and it should be understood that modifications, equivalents, and/or alternatives on the various embodiments described herein can be variously made. With regard to description of drawings, similar components may be marked by similar reference numerals.

In the disclosure disclosed herein, the expressions "have," "may have," "include" and "comprise," or "may include" and "may comprise" used herein indicate existence of corresponding features (for example, elements such as numeric values, functions, operations, or components) and do not preclude the presence of additional features.

In the disclosure disclosed herein, the expressions "A or B," "at least one of A or/and B," or "one or more of A or/and B," and the like used herein may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

Terms such as "first," "second," and the like are used herein to refer to various elements of various embodiments of the present disclosure, but do not limit the elements. For example, such terms do not limit the order and/or priority of the elements, but in stead are used to distinguish one element from another element. For example, "a first user device" and "a second user device" indicate different user devices regardless of the order or priority. Without departing from the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" an other element (for example, a second element), it can be directly coupled with/to or connected to another element or coupled with/to or connected to another element via an intervening element (for example, a third element). In contrast, when an element (for example, a first element) is referred to as being "directly coupled with/to" or "directly connected to" another element (for example, a second element), it should be understood that there is no intervening element (for example, a third element).

Depending on the context, the expression "configured to (or set to)" used herein may be used interchangeably for other expressions such as "suitable for," "having the capacity to," "designed to," "adapted to," "made to," or "capable of." The term "configured to (or set to)" must not be interpreted to mean only "specifically designed to" in hardware. Instead, the expression "a device configured to" may mean that the device is "capable of" operating together with another device or other components. For example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in the present disclosure are used to describe specified embodiments of the present disclosure and are not intended to limit the scope of other embodiments. Singular terms may also refer to the plural unless otherwise specified. Unless otherwise defined herein, all the terms used herein, which include technical or scientific terms, may have the same meaning that is generally understood by a person skilled in the art. Further, it should be understood that when applicable, terms should be given their contextual meanings in the relevant art. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PM Ps), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™, Apple TV™, or Google TV™), game consoles (for example, Xbox™ and PlayStation™) electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA) device, a magnetic resonance imaging (MRI) device, a computed tomography (CT) device, scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or Internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according, to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development FIG. 1A is a perspective view illustrating a front face of an electronic device according to an embodiment, and FIGS. 1B(a) to 1B(e) respectively illustrate a front view, a rear view, a top view, a bottom view, and a left side view of the electronic device according to an embodiment. As shown in the figures, an orthogonal coordinate system is used, in which the X axis direction may refer to the transverse direction of the electronic device, the Y axis may refer to the longitudinal direction of the electronic device, and the Z axis may refer to the thickness direction of the electronic device.

Figure 1B:
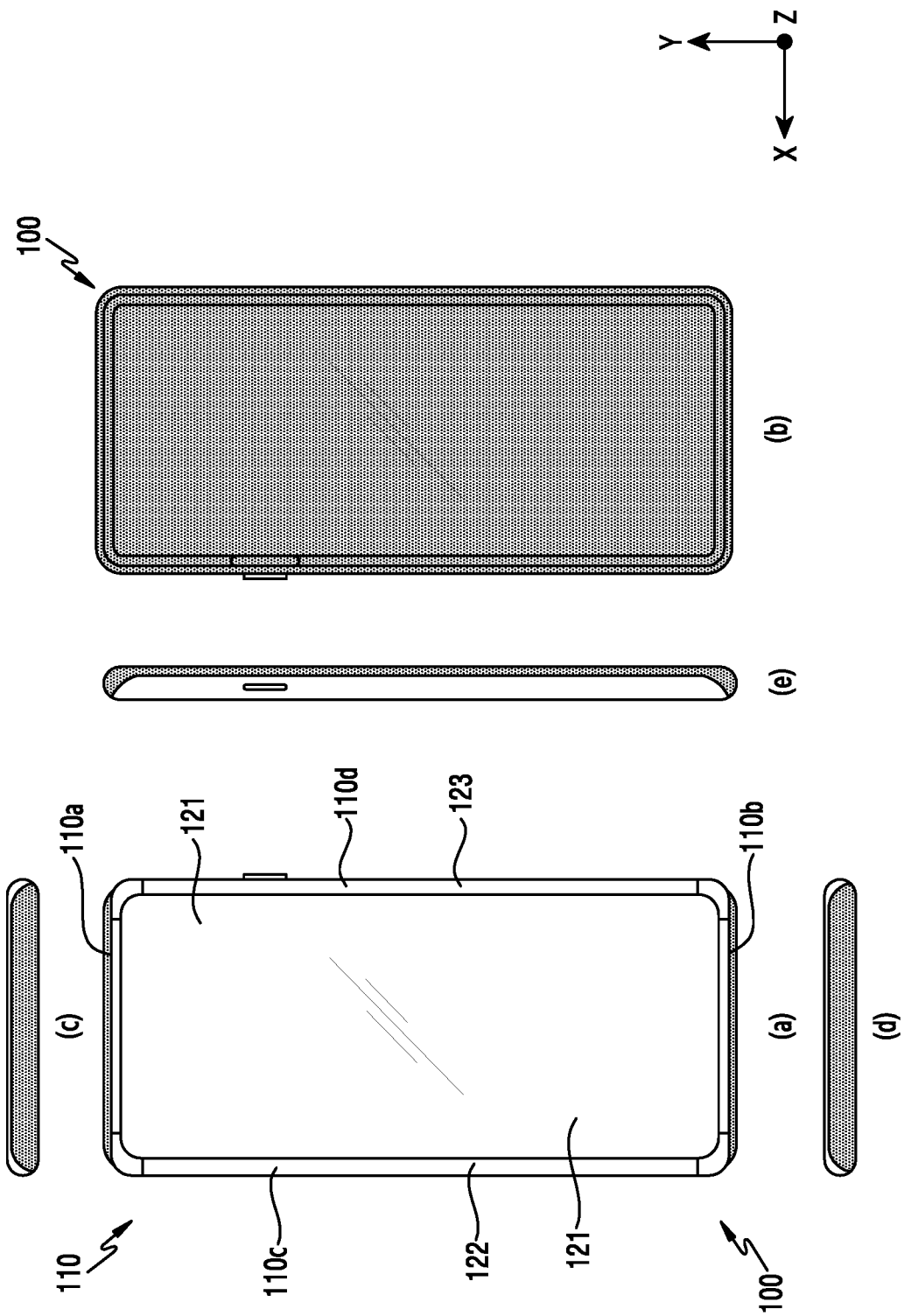

Referring to FIGS. 1A and 1B, the electronic device 100 according to an embodiment may include a housing 110 that forms the exterior of the electronic device 100 and protects electronic components of the electronic device 100. The housing 110 according to an embodiment may include a first face that faces in a first direction ①, a second face that faces in a second direction ②, the second direction ② being opposite to the first direction ①, and may include at least one side face that faces in a lateral direction, the lateral direction being perpendicular to the first and second directions ① and ②. The portion of the housing 110 on the side face may at least partially enclose a space between the first and second faces. The lateral direction may include a third direction ③ and/or a fourth direction ④. The first face of the housing 110 may include a first plate and the second face of the housing 110 may include a second plate.

In the housing 110 according to an embodiment, when the first direction ① faces upward, the first face may be the top or front face of the housing, and when the second direction ② faces downward, the second face may be the rear face of the housing.

According to an embodiment, the housing 110 may include a plurality of side faces. For example, the side faces may include a side face on the upper edge 110a of the housing 110, a side face on the lower edge 110b of the housing, a side face on the left edge 110c of the housing, and a side face on the right edge 110d of the housing. The upper edge 110a, the lower edge 110b, the left edge 110c, and the right edge 110d may together constitute a rim or a perimeter of the electronic device 100.

According to an embodiment, the electronic device 100 may include a single display 120. The single display 120 according to an embodiment may include a flat display 121 and one or more curved displays 122 and 123 disposed in one or more edges region of the flat display 120. For example, the display 120 may occupy at least 50% of the surface area of the first face. According to an embodiment, the display 120 may include a display module and a transparent member (e.g., a glass cover or a transparent window). The display module may include a display panel and a touch panel. The flat display 121 and the curved displays 122 and 123 may be implemented with a single flexible-type display module.

According to an embodiment, the flat display 121 may be disposed in at least a part of the first face, and the curved displays 122 for example may be disposed in at least a part of the side face of the housing 110.

Although the first and second curved displays 122 and 123 are illustrated as being disposed at the left and right edges of the flat display 121 in the present embodiment, the curved displays are not so limited. For example, the first and second curved displays 122 and 123 may be disposed at various other edge regions of the flat display 121.

For example, the curved display may be disposed at any one of the upper edge 110a, the lower edge 110b, the left edge 110c, the right edge 110d of the housing. FIG. 1A and FIGS. 1B(a) to 1B(e) illustrate a configuration in which the first and second curved displays 122 and 123 are disposed at the left and right edges 110c and 110d of the flat display 121, respectively. Side faces of the housing 110 may be disposed at the upper and lower edges 110a and 110b where the first and second curved displays 122 and 123 are not disposed. These side faces may be made of metal and may operate as an antenna radiator when they are properly insulated from the rest of the housing by an insulator.

Although not illustrated in the drawings, a speaker for outputting sounds may be disposed on the upper edge 110a of the flat display 121 according to an embodiment. At the lower edge of the flat display 121, a microphone for capturing sounds may be disposed.

Electronic components for performing various functions of the electronic device 100 may be disposed in the housing 110. The electronic components may include at least one sensor module. Such a sensor module may include at least one of an illuminance sensor (e.g., an optical sensor), a proximity sensor (e.g., an optical sensor), an infrared sensor, and an ultrasonic sensor. According to an embodiment, the electronic components may include a front camera and a rear camera.

According to an embodiment, the display 120 may be a full display screen so as to occupy the majority of the front face of the electronic device 100. A main home screen is the first screen that is displayed on the display 120 when the power of the electronic device 100 is turned on. When the electronic device 100 has several pages of different home screens, the main home screen may be the first home screen among the several pages of home screens. On the home screen, shortcut icons for executing frequently used applications, a main menu switching key, time, weather, or the like may be displayed.

Various electronic components may be disposed at or near the lower edge 110b of the housing according to an embodiment. For example, a microphone, a speaker, an interface connector, and an ear jack hole may be disposed in the outer metal frame of the lower portion of the housing 110.

According to an embodiment, various electronic components may be disposed at or near the upper edge 110a. For example, a socket device configured to receive a card-type external device may be disposed at or near the upper edge 110a. The socket device may accommodate a unique ID card (e.g., a SIM card or a UIM card) for the electronic device or a memory card for expanding a storage space. An infrared sensor module may be disposed on one side of the socket device, and an auxiliary microphone device may be disposed on one side of the infrared sensor module.

At least one first side key button 124 may be disposed in the second curved display 123 according to an embodiment. The side key button 124 may perform a power on/off function, a wake-up/sleep function, and the like of the electronic device.

A rear camera (not illustrated) may be disposed on the rear face 1002 of the electronic device 100 according to an embodiment, and at least one electronic component may be disposed on one side of the rear camera. For example, the electronic components may include at least one of a fingerprint sensor, an illuminance sensor (e.g., an optical sensor), a proximity sensor (e.g., an optical sensor), an infrared sensor, an ultrasonic sensor, a heart rate sensor, and a flash device.

According to an embodiment, the electronic device 100 may selectively display information by controlling the display module. For example, the electronic device 100 may display content only on the flat display 121 by controlling the display module. Alternatively, the electronic device 100 may control the display module to display content on the first and/or second curved displays 122 and 123 together with the flat display 121. As yet another alternative, the electronic device 100 may control the display module to display content on the first and/or second curved displays 122 and 123 but not on the flat display 121.

Figure 2:
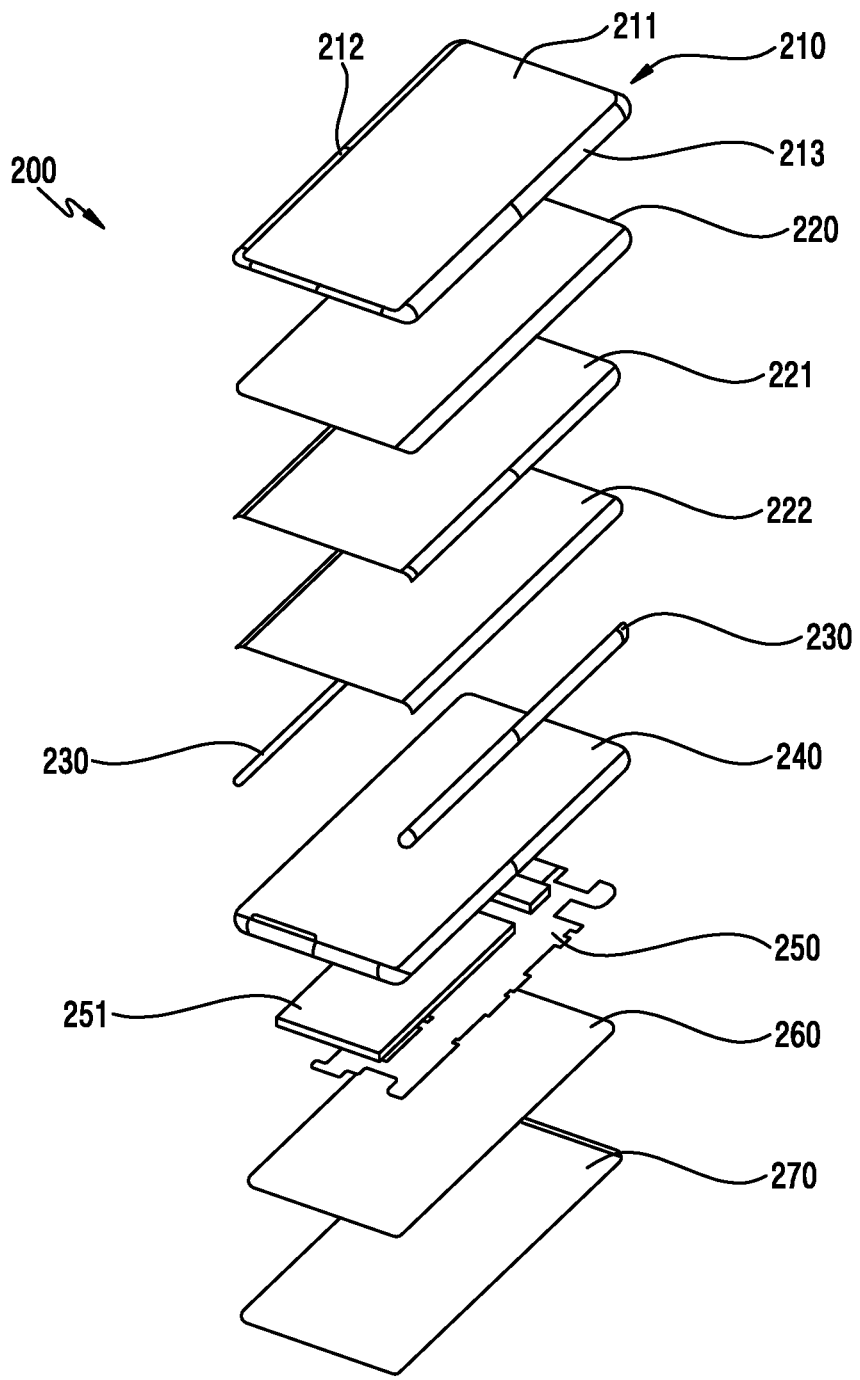
FIG. 2 is an exploded perspective view illustrating an internal configuration of an electronic device according to an embodiment of the present disclosure.

FIG. 2 is an exploded perspective view of an internal configuration of an electronic device according to an embodiment. The electronic device 200 according to this embodiment may be at least partially or wholly the same as the electronic device 100 illustrated in FIG. 1

Referring to FIG. 2, the electronic device 200 according to an embodiment may include a first transparent member 210, a display 221, a support structure 240, a support member 230, a PCB 250, a battery pack 251, a housing 260, and a second transparent member 270.

According to an embodiment, the battery pack 251 is seated in a space formed in the housing 260, and may be disposed to avoid the PCB 250. According to one embodiment, the battery pack 251 and the PCB 250 may be layered on top of each other.

According to an embodiment, the display 221 may be fixed to one face of the support structure 240, and the first transparent member 210 may be attached to the display 221 by a first adhesive member (e.g., optical clear adhesive (OCA) or optical clear resin (OCR)) 200. According to an embodiment, the second transparent member 270 may be attached to the housing 260 by a second adhesive member. Reference numeral 222 may refer to a copper sheet for shielding and a black sponge for impact mitigation.

The first transparent member 210 according to an embodiment is made of synthetic resin or glass, and include a flat portion 211 and a left bent portion 212 and a right bent portion 213, which are bent in the opposite directions. The shapes of the left and right bent portions 212 and 213 in three dimensions are illustrated in FIG. 2. However, in addition to the left and right bent portions, the upper and lower portions of the first transparent member 210 may also be bent. According to one embodiment, a touch panel may be further disposed on the rear face of the first transparent member 210, so that the touch panel may receive touch input signals generated by the user.

According to an embodiment, the display 221 may be formed in a shape corresponding to the first transparent member 210, i.e. the shape of the display 221 has a curvature corresponding to that of the first transparent member 210. According to one embodiment, since the display 221 has been described above in detail with reference to FIGS. 1A and 1B, detailed description will be omitted here.

According to an embodiment, the first adhesive member 220 is a member for bonding the transparent member 210 to the display 221, and may be a piece of adhesive tape such as a piece of double-sided tape, or a liquid adhesive layer. For example, when the double-sided tape is used as the first adhesive member 220, a general polyethyleneterephthalate (PET) material or a functional substrate may be used as an inner substrate. Thus, it is possible to strengthen the impact resistance using a piece of foam tape or a base material made of an impact-resistant fabric, so that the front window can be prevented from being damaged by an external impact.

According to an embodiment, the support structure 240 may be disposed within the electronic device 200, and may be used to strengthen the overall rigidity of the electronic device. For example, the inner support structure 240 may be made from aluminum (Al), magnesium (Mg), and stainless steel (STS). According to one embodiment, for the inner support structure 240, a high-rigidity synthetic resin containing glass fiber may be used, or a metal and a synthetic resin may be used together. According to one embodiment, when a metal member and a non-metal member are used together as the material of the inner support structure 240, the inner support structure 240 may be formed by insert-injection-molding the non-metal member on the metal member. The inner support structure 240 may be placed on the rear face of the display 221 and may have a shape (curvature) similar to that of the rear face of the display 221, so that the inner support structure 240 can support the display 221. According to one embodiment, between the inner support structure 240 and the display 221, sheets such as an elastic member (e.g., sponge or rubber) and an adhesive layer (e.g., double-sided tape or single-sided tape) may be additionally disposed in order to protect the display 221.

According to an embodiment, the support structure 240 may be fastened to the housing (e.g., the rear case) 260 and may create a space therein, in which at least one electronic component may be disposed. The electronic components may include a printed circuit board (PCB) 250. Without being limited thereto, however, the electronic components may include an antenna device, a sound device, a power supply device, a sensor device, and the like, in addition to the PCB 250.

A battery pack 251 according to an embodiment may supply power to the electronic device 200. According to an embodiment, the battery pack 251 may be integrally disposed in the electronic device 200. Without being limited thereto, however, the battery pack 251 may be implemented to be detachable when the rear housing 260 is implemented to be also detachable from the electronic device 200.

According to an embodiment, the housing 260 may form the exterior (e.g., the side face including a metal bezel) of the electronic device 200, and may be coupled to the support structure 240 so as to form the inner space accommodating the electronic components. According to one embodiment, since the housing has been described above in detail with reference to FIG. 1A and FIGS. 1B(a) to 1B(e), a detailed description thereof will be omitted here.

According to an embodiment, a second transparent member 270 may be in a shape similar to that of the first transparent member 210. The first transparent member 210 may be referred to as the front window, and the second transparent member 270 may be referred to as the rear window.

According to an embodiment, the support member 230 may be fixed to the support structure 240 and may support the first and second curved displays located in the left and right edges of the display 220. The support member 230 may be in an elongated shape and may be made of a strong material such as metal. The support member 230 may be disposed in at least one edge region of the support structure 240.

Figure 3:
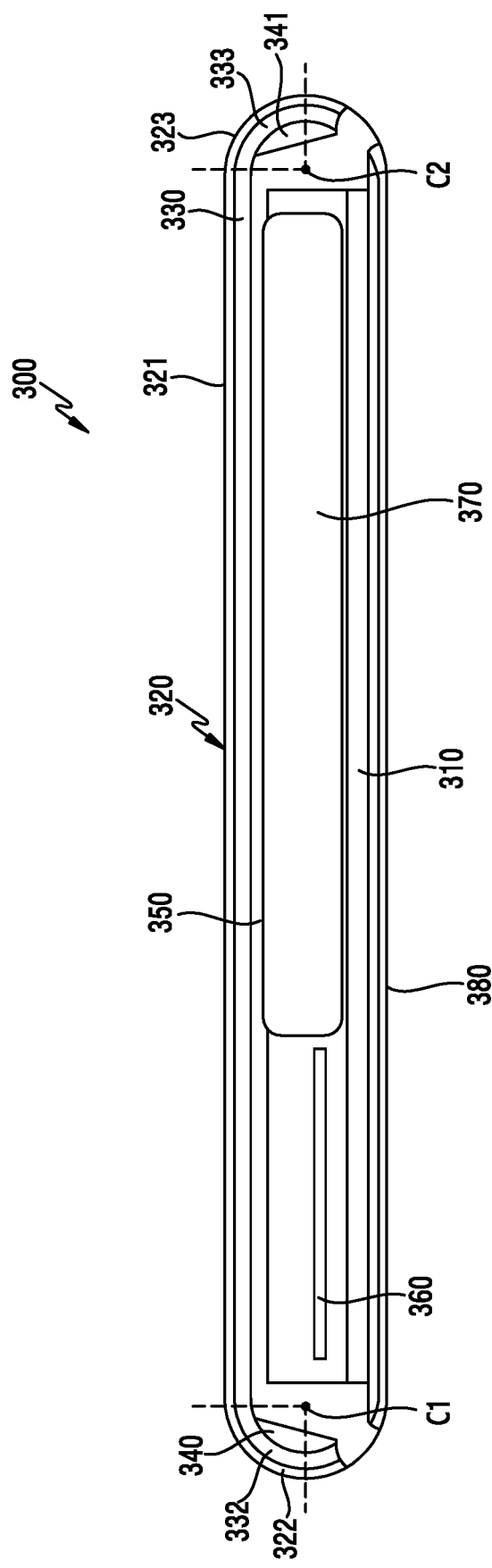
FIG. 3 is a sectional view illustrating an internal stacked structure of an electronic device according to an embodiment of the present disclosure.

Referring to FIG. 3, according to an embodiment, the electronic device 300 may be partly or entirely the same as the electronic device 200 illustrated in FIGS. 1A and 1B, or the electronic device 200 illustrated in FIG. 2. According to an embodiment, the electronic device 300 may include a housing 310, a first transparent member 320, a display 330, a support member 340, a support structure 350, a PCB 360, a battery pack 370, and a second transparent member 380.

According to an embodiment, the housing 310 may include one or more support members (e.g., first and second members 340 and 341) that support first and second curved displays 332 and 333. The housing 310 may also include a support structure 350 (e.g., a bracket or support bracket). For example, each of the first and second support members 340 and 341 may be respectively disposed along the side surfaces of the support structure 350 and may have elongated shapes. The first and second side surfaces of the support structure 350 may be side surfaces that are opposite to each other, and the first and second support members 340 and 341 may be disposed to be opposite to each other.

According to an embodiment, each of the first and second support members 340 and 341 may be coupled to the support structure 350 so as to respectively support and maintain the fixed state of the first and second curved displays 332 and 333. As will be described later, one or more antenna radiators may be mounted on the first support member 340, and one or more other antenna radiators may be mounted on the second support member 341. In addition, the first support member 340 may be disposed along and proximate to the first face of the housing 310, and the second support member 341 may be disposed along and proximate to the second face of the housing 310.

According to an embodiment, the first curved display 332 may have a displaying portion, which has a first curvature and extends to a first rotation angle θ1 of 90 degrees or more (see FIG. 4) about the center C1 of the first curvature. According to an embodiment, the second curved display 333 may have a displaying portion, which has a second curvature and extends to a second rotation angle (equal to the first rotation angle) of about 90 degrees or more about the center C2 of the second curvature. The first and second curvatures may be equal to, or different from, each other.

According to an embodiment, the display 330 may include a first transparent member 320 in the first direction of the housing 310. The first transparent member 320 may be superimposed on the display 330 and be in close contact with the display 330. For example, the first transparent member 320 may include a transparent synthetic resin material or a glass material. The first transparent member 320 may include a flat transparent member portion 321 and first and second curved transparent member portions 322 and 323 conforming to the display 330. According to an embodiment, the first curved transparent member 322 may extend to a third rotation angle θ2 of 90 degrees or more (see FIG. 4) about the center C1 of the first curvature, and the second curved transparent member 323 may extend to a fourth rotation angle (equal to the third rotation angle) of 90 degrees or more about the center of the second curvature. The first curved transparent member 322 may extend to the rotation angle θ1 which is substantially the same as that of the first curved display 332 or to the rotation angle θ2, which is larger than the first curved display 332. The second curved transparent member 323 may extend to the rotation angle θ1 which is substantially the same as that of the second curved display 333 or to the rotation angle θ2, which is larger than the second curved display 333.

According to an embodiment, the PCB 360 is disposed within the support structure 350, and may be disposed in parallel with the battery pack 370. A first face of the PCB 360 may face the first direction (e.g. upwards in FIG. 3) and a face of the support structure 350. A second face of the PCB 360 may face the second direction (e.g. downwards in FIG. 3) and the housing. The housing 310 may include a back cover or a rear case. A second transparent member 380 may be provided in the second direction of the second face of the housing 310. The second transparent member 380 may be made of a transparent synthetic resin material or a glass material.

Figure 4:
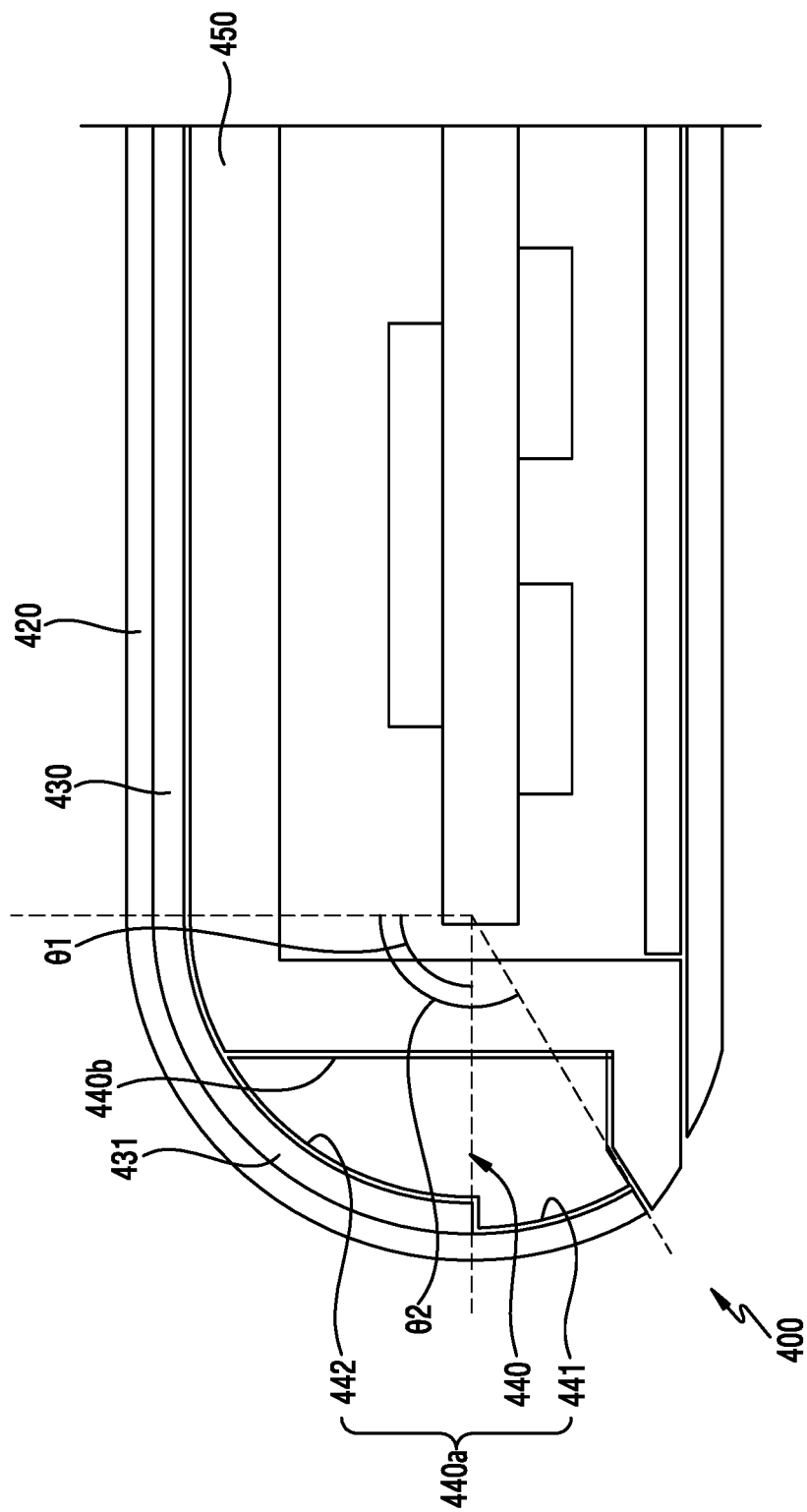
FIG. 4 is a sectional view illustrating a main portion of an internal stacked structure of an electronic device according to an embodiment of the present disclosure.

Referring to FIG. 4, according to an embodiment, the electronic device 400 may be an electronic device partly or entirely the same as the electronic device 300 illustrated in FIG. 3. According to an embodiment, the support member 440 may be at least partially or entirely the same as the support members 340 and 341 illustrated in FIG. 3.

According to an embodiment, the support member 440 may include an outer face 440a and an inner face 440b. The outer face 440a may be a face which faces the curved display 431 of the display 430 and the inner face 440b may be a face which faces the support structure 450. As will be described below, a conductive member capable of receiving radio signals, for example, an antenna radiator (illustrated in FIG. 5), may be mounted on the outer face 440a.

According to an embodiment, the outer face 440a may include a first outer face 441 and a second outer face 442. The second outer face 442 may be separated from the first face 441 by a step portion. The first outer face 441 may extend outwardly from the second outer face 442. The first outer face 441 may have a first curvature, and the second face 442 may have a second curvature. The first and second curvatures may be equal to, or different from, each other. An antenna radiator may be mounted on only the first outer face 441, an antenna radiator may be mounted on only the second outer face 442, or first and second antenna radiators may be mounted on both the first and second outer surfaces 441 and 442, respectively. The first outer face 441 may directly face the transparent member 420, and the second face 442 may directly face the curved display 431.

According to an embodiment, the support member 440 may function to prevent the curved display 431 from being damaged during the assembly process and may support the display 430 along with the support structure 450.

Figure 5:
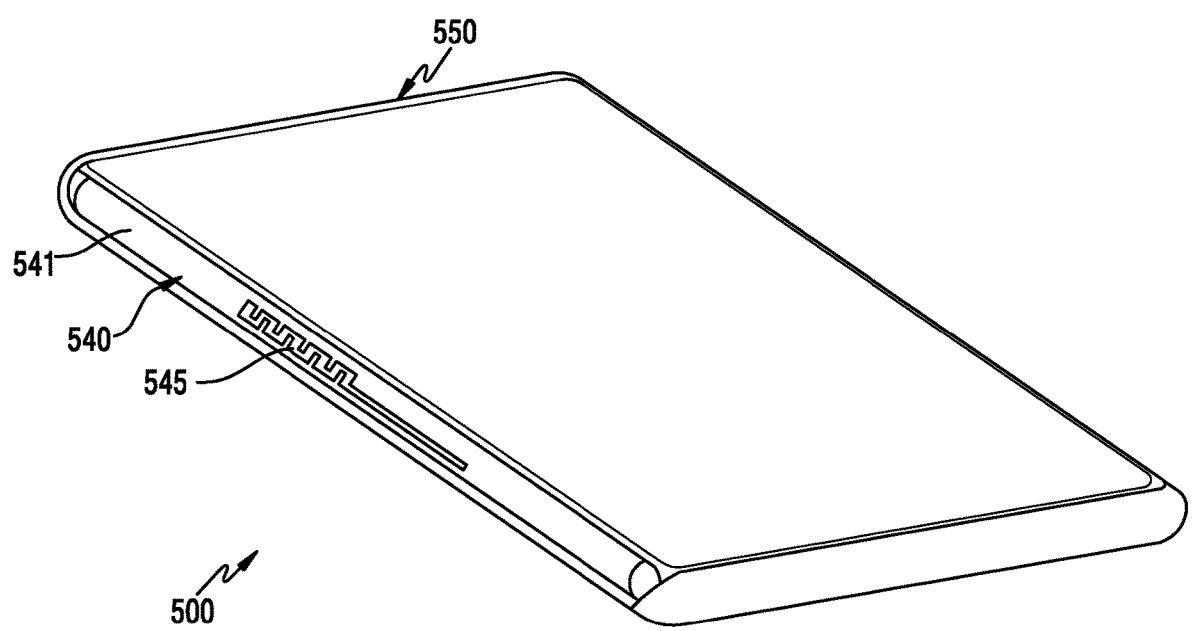
FIG. 5 is a perspective view illustrating a state in which an antenna radiator is disposed on a support member according to an embodiment of the present disclosure.

Referring to FIG. 5, according to an embodiment, the electronic device 500 may be an electronic device partly or entirely the same as the electronic device 400 illustrated in FIG. 4. According to an embodiment, at least one antenna radiator 545 may be mounted on a support member 550. The antenna radiator 545 may be configured in a specific pattern shape on the outer face 541 of the support member 550. Although not illustrated in the figure, the antenna radiator 545 mounted on the outer face 541 of the support member may operate as an antenna device and include a feed path and a ground path.

The antenna radiator 545 may be applied to the support member 540 using an In-Molding Antenna (IMA), Laser Direct Structuring (LDS), or a SUS plate. When using IMA, the antenna pattern may be formed integrally with the housing by employing injection molding. When using LDS, the antenna pattern may be a pattern formed on a synthetic resin using a laser. Plating of a metal such as silver or copper is then used to form the antenna pattern. In the case of using the SUS plate, the antenna pattern may be formed on a metal plate and may be bonded onto the housing.

Figure 6A:
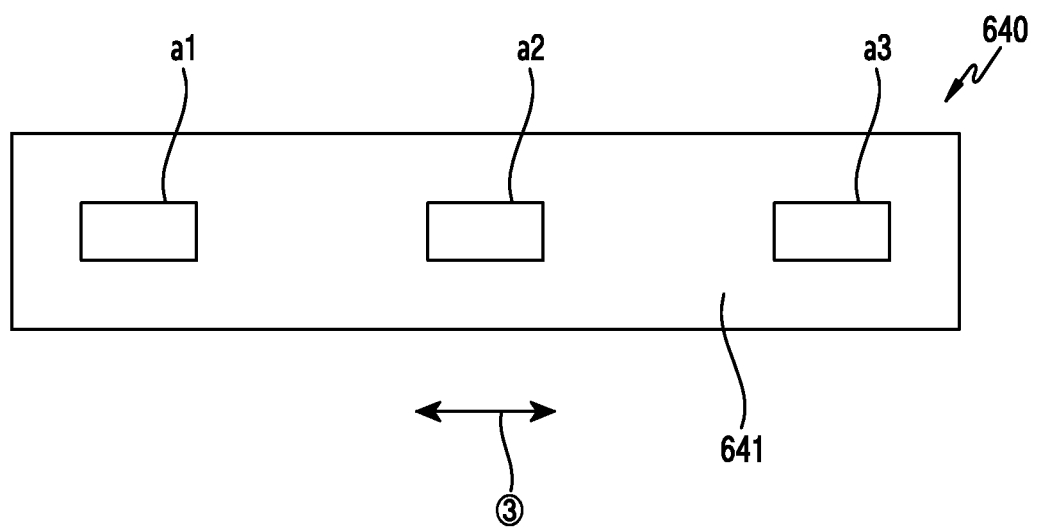
FIG. 6A, FIG. 6B, FIG. 6C and FIG. 6D are exemplary views schematically illustrating various configuration of antennas disposed on support members according to various embodiments of the present disclosure.
Figure 6B:
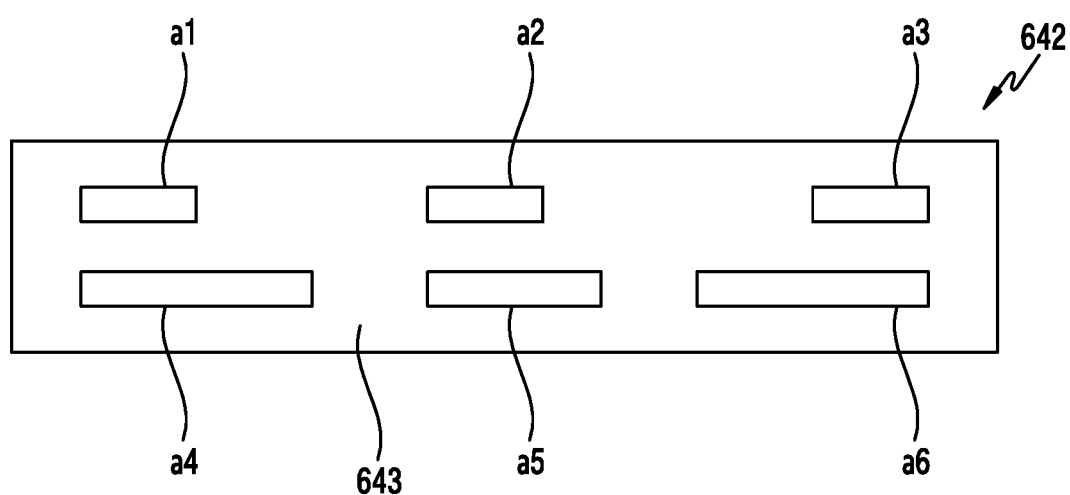
Figure 6C:
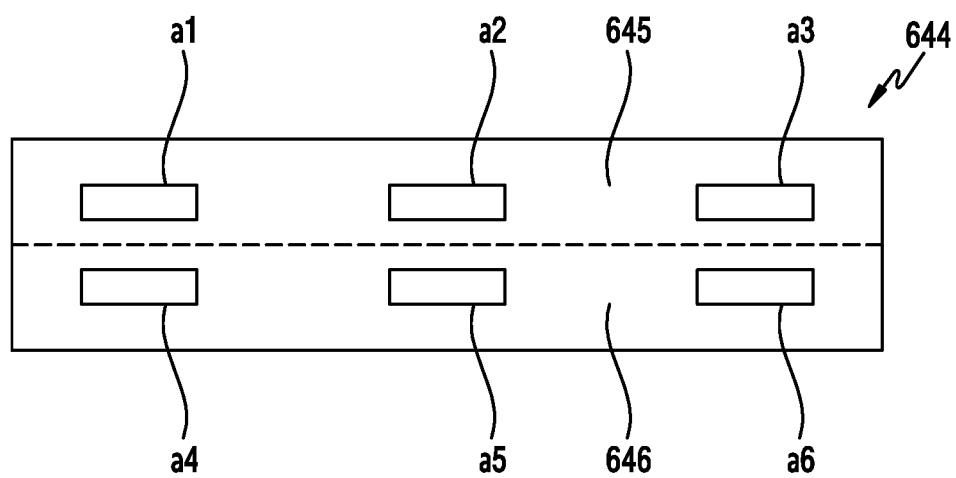

Referring to FIGS. 6A to 6C, support members according to various embodiments may be at least partially or entirely the same as the support member illustrated in FIG. 5. Antenna arrangements mounted on the outer face of the support member according to various embodiments will be described.

Referring to FIG. 6A, according to an embodiment, a plurality of antenna radiators a1 to a3 may be mounted on the outer face 641 of the support member 640 along the longitudinal direction ③ of the support member 640 (e.g. along the side face of the housing) and may be disposed to be spaced apart from each other by a specific distance.

According to an embodiment, each of the antenna radiators a1-a3 may selectively operate depending on the required band of a switching device (not illustrated). Each of the antenna radiators a1 to a3 may be provided with electrical connections so that they are fed and grounded on a printed circuit board (not illustrated).

Referring to FIG. 6B, according to an embodiment, a plurality of antenna radiators a1 to a6 may be mounted in such a manner that a plurality of antenna radiators a1 to a3 and a plurality of antenna radiators a4 to a3 may be mounted in the longitudinal direction of the support member 642. The antenna radiators a1 to a6 may be arranged such that antenna radiators a1 and a4, antenna radiators a2 and a5, and antenna radiators a3 and a6 are aligned in a direction perpendicular to the longitudinal direction of the support member 642. The antenna radiators a1 to a6 may be further arranged to be spaced from each other by a specific distance.

According to an embodiment, each of the antenna radiators a1 to a6 may selectively operate depending on the required band of a switching device (not illustrated). Each of the antenna radiators a1 to a6 may be provided with electrical connections so that they are fed and grounded on a printed circuit board (not illustrated).

Referring to FIG. 6C, according to an embodiment, the plurality of antenna radiators a1 to a6 may be mounted in such a manner that a plurality of antenna radiators a1 to a3 and a plurality of antenna radiators a4 to a6 are respectively mounted on the first and second outer faces 645 and 646 in the longitudinal direction of the support member 644.

According to an embodiment, each of the antenna radiators a1 to a6 may selectively operate depending on the required band of a switching device (not illustrated). Each of the antenna radiators a1 to a6 may be provided with electrical connections so that they are fed and grounded on a printed circuit board (not illustrated).

Figure 6D:
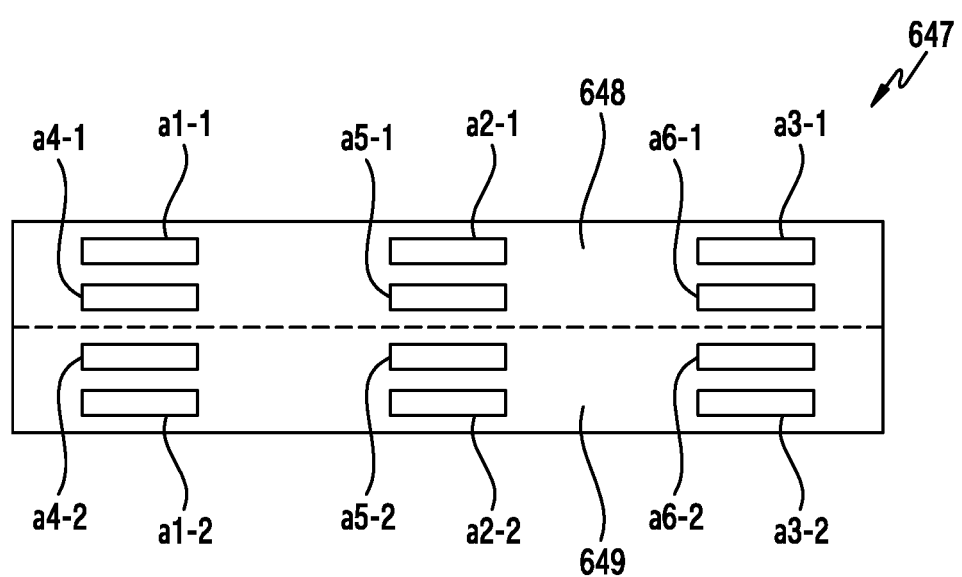

Referring to FIG. 6D, according to an embodiment, a plurality of antenna radiators a1-1 to a6-1 and a1-2 to a6-2 may be mounted in such a manner that a plurality of antenna radiators a1-1 to a6-1 and a plurality of antenna radiators a1-2 to a6-2 are respectively mounted on the first and second outer faces 648 and 649 of the support member 647 in a 3×2 pattern.

According to an embodiment, each of the antenna radiators a1-1 to a6-1 and a1-2 to a6-2 may selectively operate depending on the required band of a switching device (not illustrated). Each of the antenna radiators a1-1 to a6-1 and a1-2 to a6-2 may be provided with electrical connections so that they are fed and grounded on a printed circuit board (not illustrated).

Hereinafter, an electrical connection path for electrically connecting an antenna radiator to a printed circuit board will be described with reference to the accompanying drawings.

Figure 7:
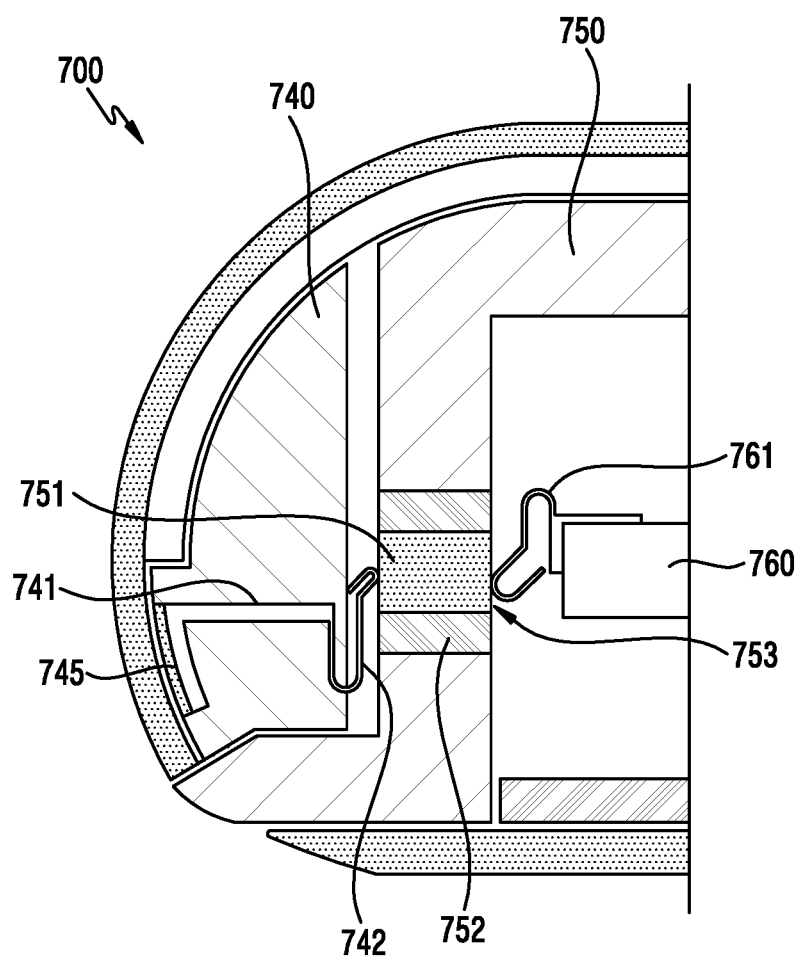
FIG. 7 is a sectional view illustrating an electrical connection path via which an antenna radiator according to an embodiment of the present disclosure is electrically connected to a printed circuit board.

Referring to FIG. 7, the electrical connection path of an antenna radiator 745 may include first to fourth conductive structures 741, 742, 753, and 761.

According to an embodiment, the first conductive structure 741 may be electrically connected to the antenna radiator 745 and may be mounted on the support member 740. For example, the first conductive structure 741 may be formed in the support member 740 using insert injection molding. The first conductive structure 741 may extend in a horizontal direction, i.e. a transverse direction of the electronic device. One end of the first conductive structure 741 may be connected to the antenna radiator 745, and the other end may be electrically connected to one end of the third conductive structure 742.

According to an embodiment, the second conductive structure 753 may be mounted on support structure 750 and may be made of a metal. The second conductive structure 753 may be formed in the support structure 750 using insert injection molding. For example, one end of the second support structure 753 may be electrically connected to one end of the third support structure 742, and the other end of the second support structure 753 may be electrically connected to one end of the fourth conductive structure 761. The second conductive structure 753 may be configured with at least one conductor 751 made of a conductive material and an insulator 752 made of an insulating material. The conductor 751 may be configured to be surrounded by the insulator 752. The second conductive structure 753 may extend in the horizontal direction. For example, the conductor 751 may extend in the horizontal direction, and the insulator 752 may be mounted on the support structure 750 as a hollow tube extending in the horizontal direction and encapsulating the conductor 751.

According to an embodiment, the third conductive structure 742 may be disposed between the first conductive structure 741 and the second conductive structure 751 so as to electrically connect the first and second conductive structures 741 and 751 to each other. The third conductive structure 742 may be a connection terminal, one end of which may be electrically connected to the first conductive structure 741, and the other end of which may be electrically connected to the second conductive structure 751. For example, the third conductive structure 742 may be a C-clip terminal having elasticity.

According to an embodiment, the fourth conductive structure 761 may be mounted on the printed circuit board 760 and be electrically connected to the second conductive structure 753. One end of the fourth conductive structure 761 may be electrically connected to one end of the second conductive structure 753, and the other end of the fourth conductive structure 761 may be fixed on the printed circuit board 760. For example, the fourth conductive structure 761 may be a connection terminal, specifically a C clip terminal having elasticity.

Figure 8A:
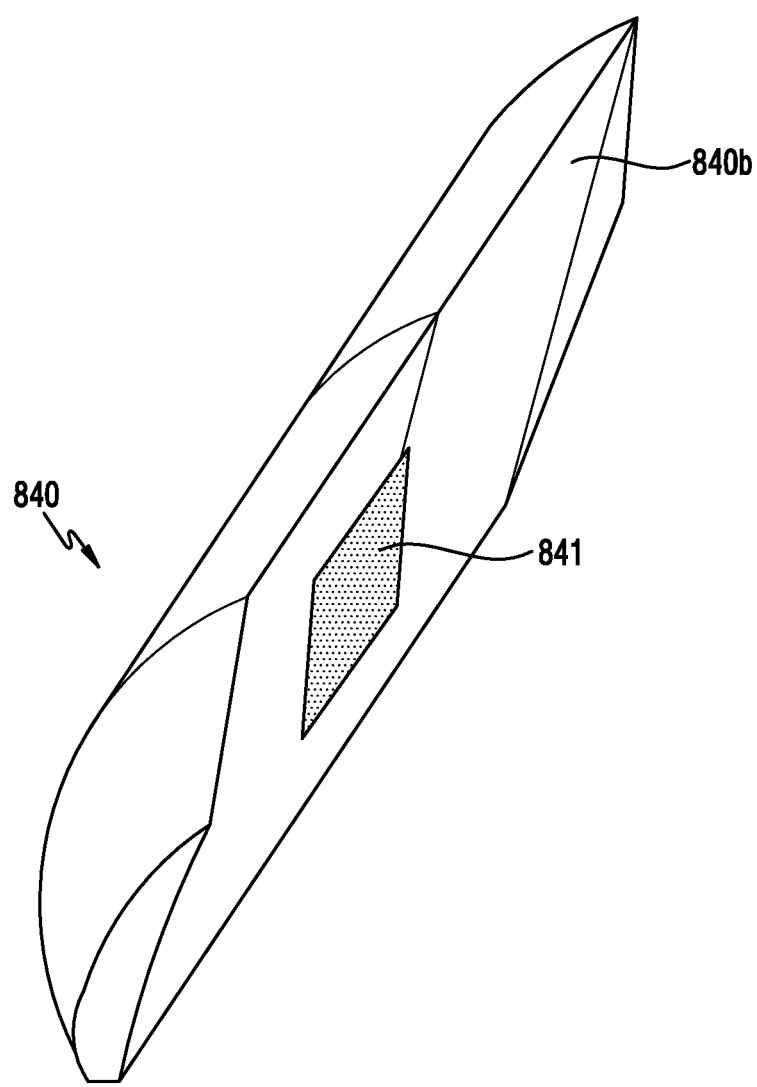
FIG. 8A is a perspective view illustrating a first conductive structure mounted on a support member according to an embodiment of the present disclosure.
Figure 8B:
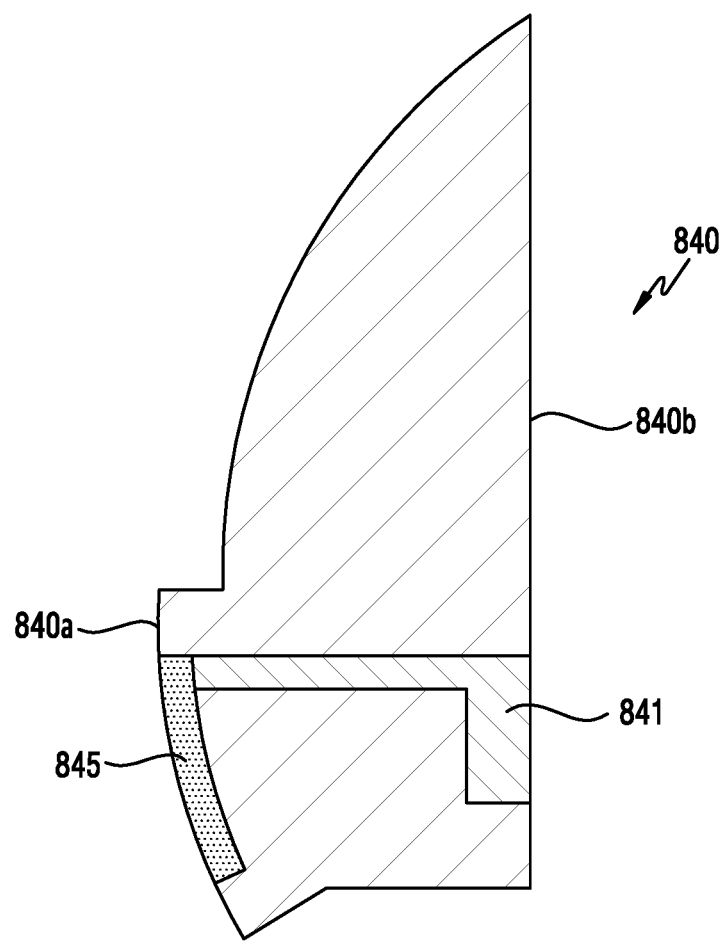
FIG. 8B is a sectional view illustrating the first conductive structure mounted on the support member according to an embodiment of the present disclosure.

Referring to FIGS. 8A and 8B, according to an embodiment, a first conductive structure 841 may be mounted on a support member 840, in which the outer face 840a of the support member 840 may be disposed such that the antenna radiator 845 is exposed thereon and the inner face 840b of the support member may be disposed such that the first conductive structure 841 is exposed thereon. For example, the first conductive structure 841 may be a pad on the inner face 840b of the support member. The first conductive structure 841 may include a portion extending from the antenna radiator 845 to the inner face 840b and a portion positioned to be exposed on the inner face 840b. For example, the portion of the first conductive structure to be exposed on the inner face 840b may be slightly recessed or slightly protrude from the inner face 840b.

Figure 8C:
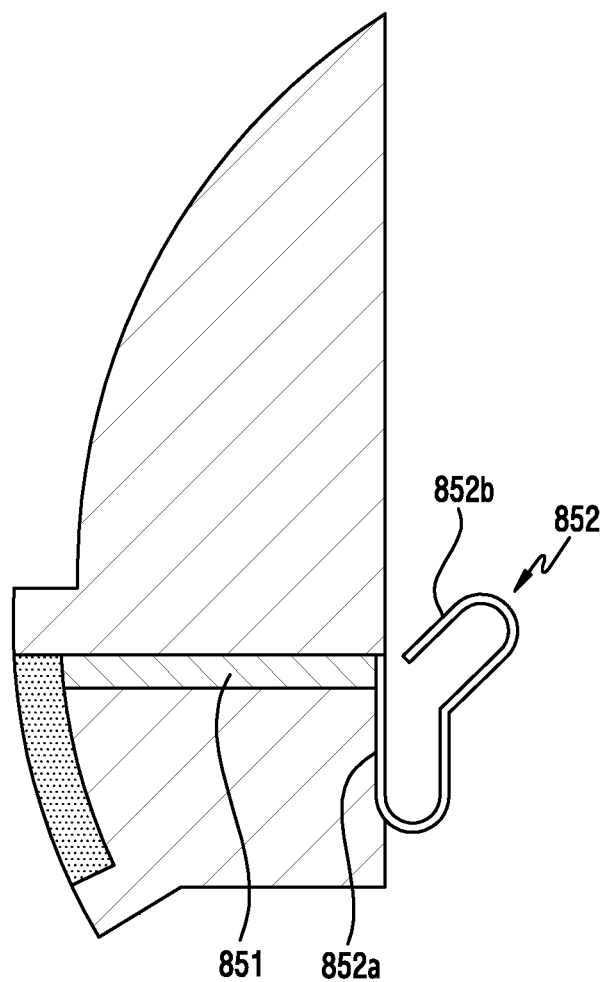
FIG. 8C is a sectional view illustrating first and third conductive structures mounted on a support member according to an embodiment of the present disclosure.

Referring to FIG. 8C, according to an embodiment, the third conductive structure 852 may be a connection terminal. Specifically, the third conductive structure 852 may be an elastically deformable connection terminal including one end 852a and the other end 852b. In the third conductive structure 852, one end 862a is fixed and connected to the first conductive structure 851 and the other end 852b is an elastically deformable free end. When assembled, the third conductive structure 852 may provide an elastic force that help maintain the electrical connection from the first conductive structure to the second conductive structure.

Figure 9A:
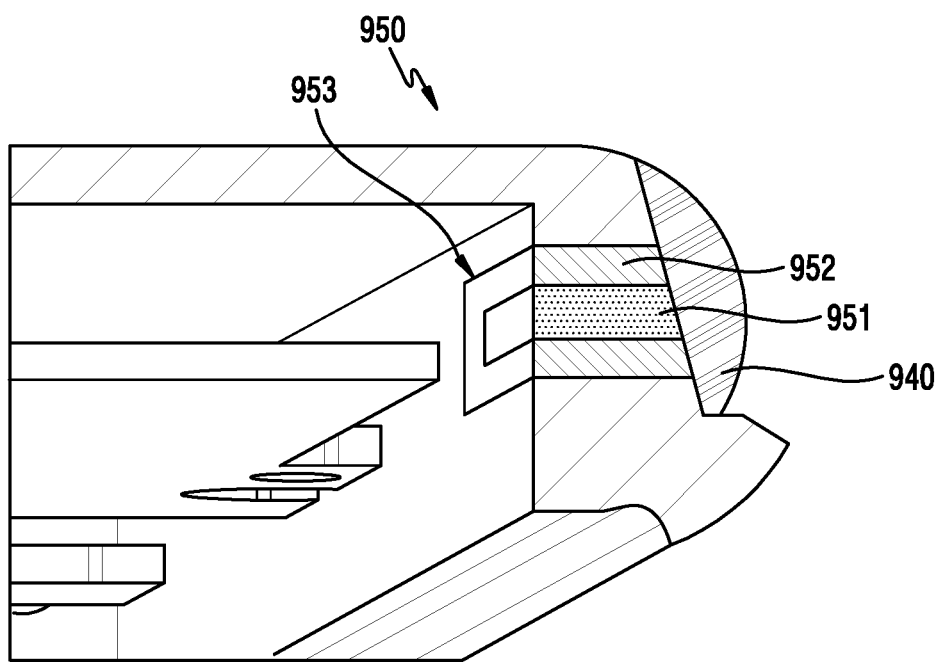
FIG. 9A is a perspective view illustrating a second conductive structure mounted on a support structure according to an embodiment of the present disclosure in which the second conductive structure is partially cut away.

Referring to FIG. 9A, according to an embodiment, the second conductive structure 953 may be formed in the support structure 950 using insert injection molding. When the support structure 950 is configured as a bracket made of a metal, the second conductive structure 953 may be configured with a conductor 951 and an insulator 952. In the second conductive structure 953, one end may be electrically connected to the third conductive structure formed on the support member 940 and the other end may be electrically connected to the fourth conductive structure. In the second conductive structure 953, the insulator 952 may be configured to enclose the conductor 951. One end of the second conductive structure 953 may be exposed on the outer face of the support structure 950 as a contact pad and the other end may be exposed on the inner face of the support structure 950 as another contact pad.

Figure 9B:
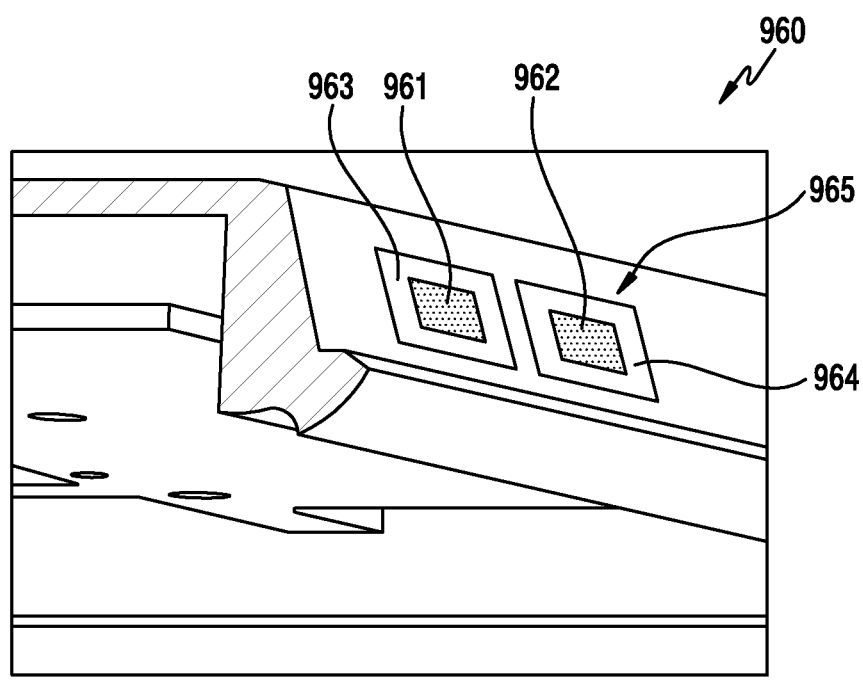
FIG. 9B and FIG. 9C are perspective views each illustrating an example of the second conductive structure mounted on the support structure according to various embodiments of the present disclosure.

Referring to FIG. 9B, according to an embodiment, the second conductive structure 965 may include first and second conductors 961 and 962, and first and second insulators 963 and 964 configured to enclose the first and second conductors 961 and 962, respectively. The first conductor 961 may be disposed to be spaced apart from the second conductor 962 by a certain distance and the first insulator 963 may be disposed to be spaced apart from the second insulator 964 by a certain distance. Each of the first and second conductors 961 and 962 may be exposed on the outer face of the support structure 960 as contact pads.

Figure 9C:
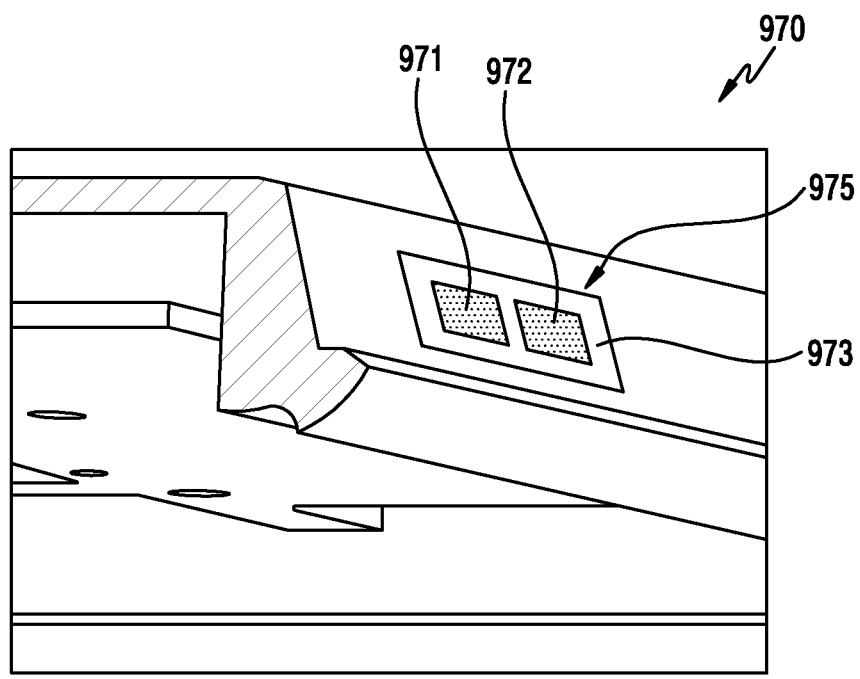

Referring to FIG. 9C, the second conductive structure 975 according to an embodiment may include first and second conductors 971 and 972 and an insulator 973 configured to enclose the first and second conductors 971 and 972. For example, one insulator 973 may be configured to enclose both the first and second conductors 971 and 972, which are spaced apart from each other by a certain distance. Alternatively, the one insulator 973 may be configured to enclose more than two conductors. Each of the first and second conductors 971 and 972 may be exposed on the outer face of the support structure 970 as contact pads.

Figure 10:
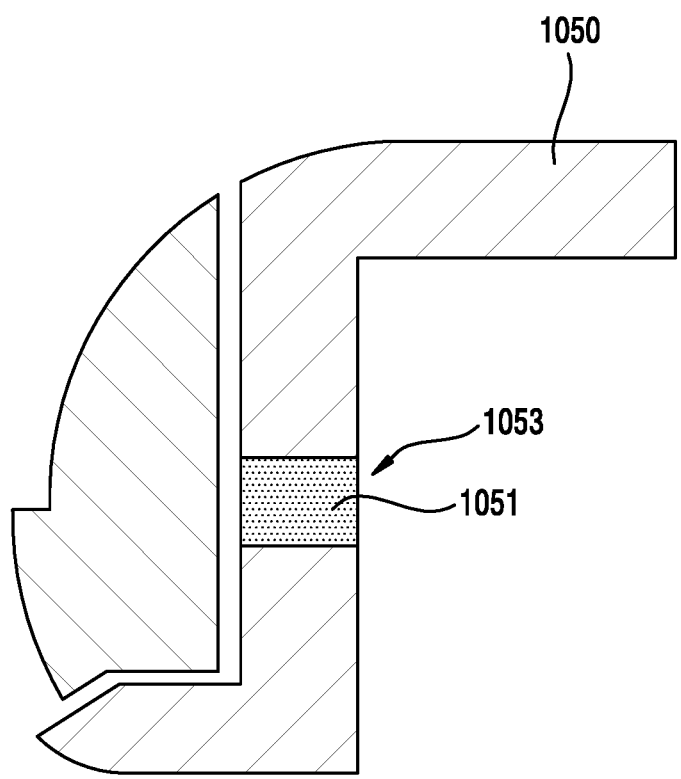
FIG. 10 is a sectional view illustrating another second conductive structure mounted on a support member according to an embodiment of the present disclosure.

Referring to FIG. 10, when according to an embodiment, the second conductive structure 1053 may be made of a non-metallic material (e.g., a synthetic resin material) rather than a metallic material, and a conductor 1051 may be formed in a support structure 1050 using insert injection molding. For example, the conductor 1051 may be made of a metallic material extending in the horizontal direction.

Figure 11:
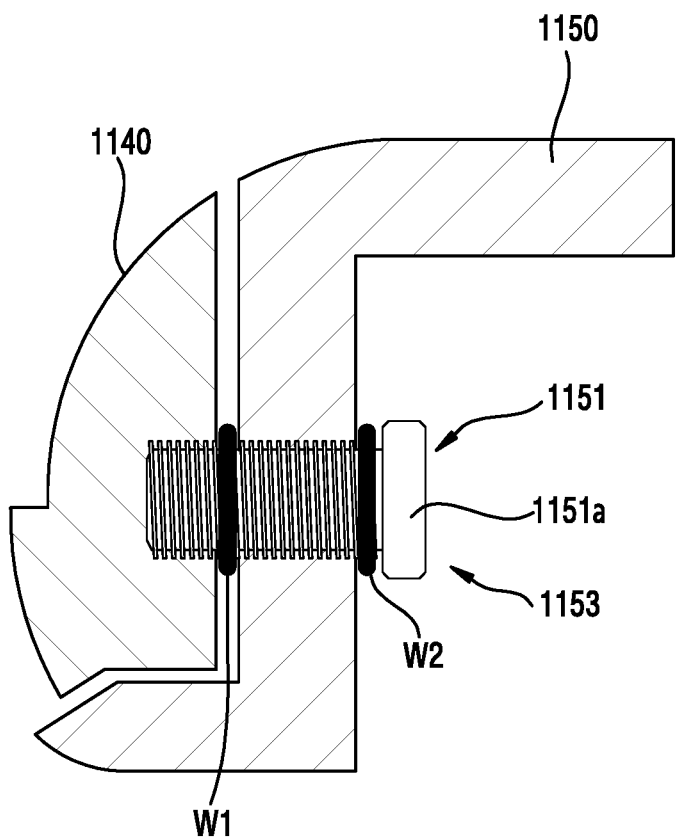
FIG. 11 is a sectional view illustrating still another second conductive structure mounted on a support member according to an embodiment of the present disclosure.

Referring to FIG. 11, according to an embodiment, for a second conductive structure 1153, a fastening structure configured to couple a support member 1140 and a support structure 1150 to each other may be utilized. The fastening structure may be made of a metallic material, so that the fastening structure can perform dual functions of fastening and providing an electrical connection path. The second conductive structure 1153 may couple the support structure 1140 and the support structure 1150 using a metallic fastener 1151 (e.g., a screw). The fastener 1151 may couple the support structure 1140 and the support structure 1150 using first and second washers w1 and w2. The fastener 1151, which is made of a metallic material, can function as an electrical connection path. The first washer w1 may be disposed between the support member 1140 and the support structure 1150 and the second washer w2 may be disposed between the support structure 1150 and the head 1151a of the fastener 1151.

Figure 12A:
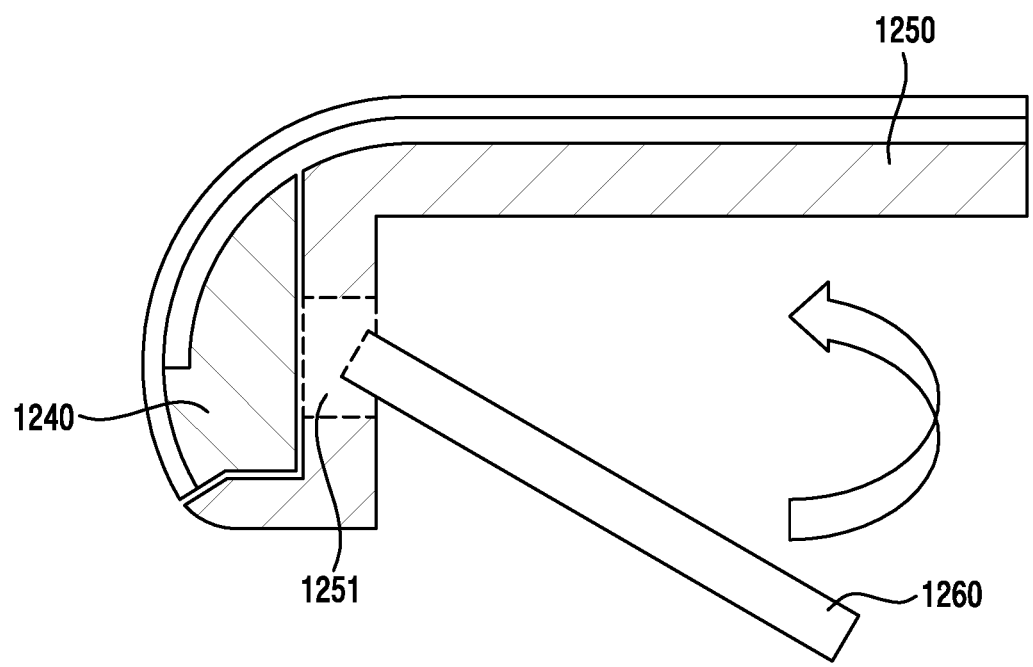
FIG. 12A is a sectional view illustrating a conductive structure disposed on a support structure including a printed circuit board according to an embodiment of the present disclosure using.
Figure 12B:
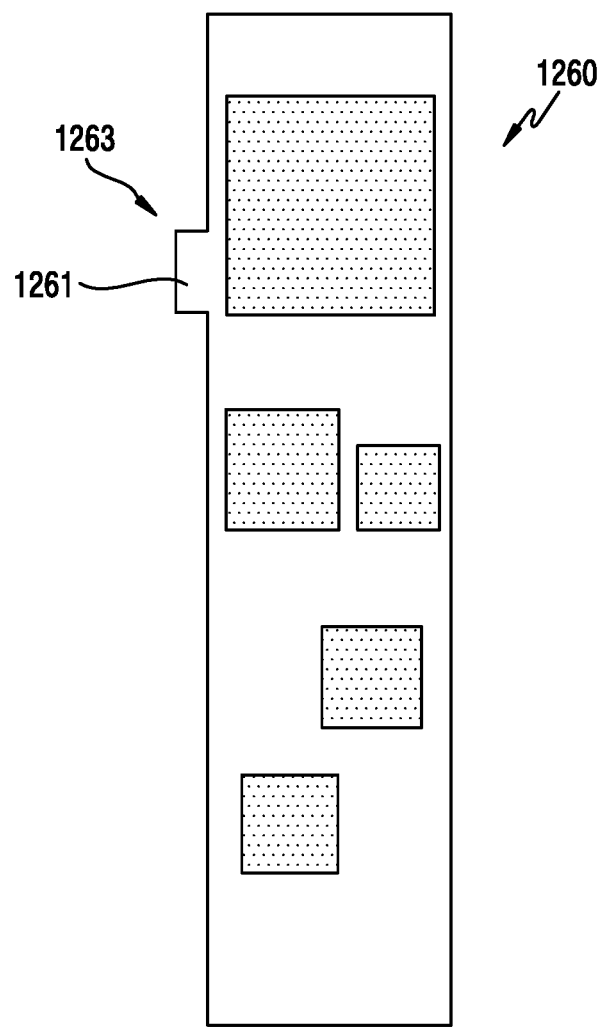
FIG. 12B is a plan view illustrating the conductive structure including the printed circuit board.

Referring to FIGS. 12A and 12B, a conductive structure for electrically connecting an antenna radiator according to an embodiment to a printed circuit board 1260 may include a first conductive structure and a second conductive structure. Since the first conductive structure is the same as the conductive structure illustrated in FIG. 8B, that is, the first conductive structure provided in the support member, its description therefore will be omitted here.

The second conductive structure 1263 according to an embodiment may include at least one opening 1251 formed in a support structure 1250 and a protrusion 1261 in which at least a part of the printed circuit board 1260 extends. The protrusion 1261 is inserted into the opening 1251 so that a first conductive structure (not illustrated) connected to an antenna radiator can be electrically connected to the printed circuit board 1260. For example, the protrusion 1261 may be provided with a connection terminal (e.g., the connection terminal illustrated in FIG. 7) so as to be electrically connected to the first conductive structure provided in the support member 1240. Alternatively, the protrusion 1261 may be modified into a structure that is connected to the support member 1240 by being inserted thereinto after penetrating the opening 1251. The protrusion 1261 may be approximately horizontally inserted into the opening 1251 so as to be electrically connected to the first conductive structure provided on the support member 1240.

Figure 13:
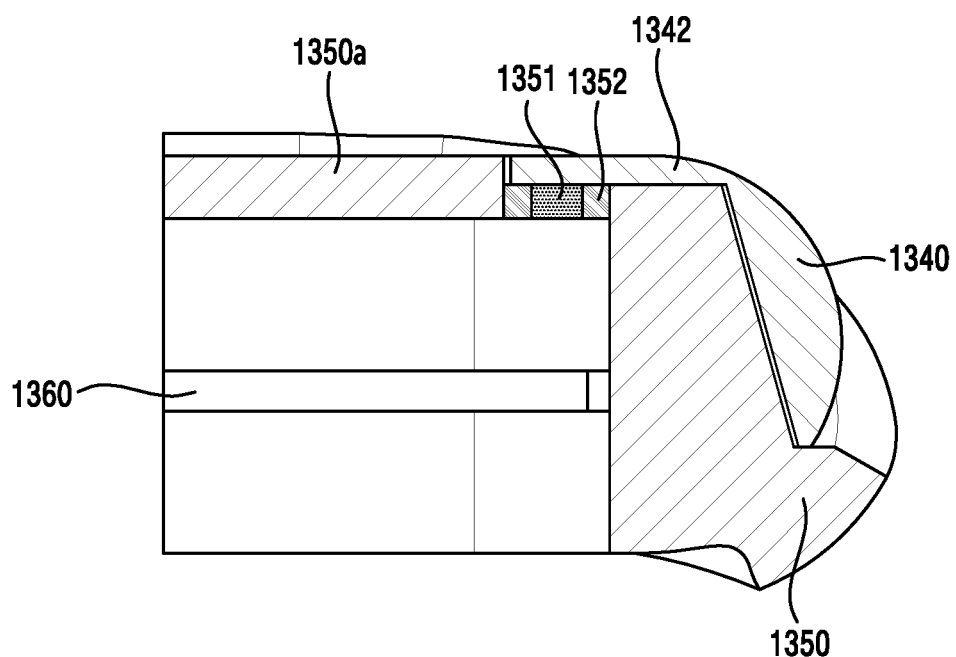
FIG. 13 is a sectional view illustrating a vertical conductive structure mounted on a support structure according to an embodiment of the present disclosure.

Referring to FIG. 13, an electrical connection path for electrically connecting the antenna radiator of an electronic device according to an embodiment to a printed circuit board may include an electrical connection structure provided in a direction perpendicular to the printed circuit board 1360.

A support member 1340 with an antenna radiator according to an embodiment may include an extension 1342 to be connected with the support structure 1350, and the support structure 1350 may include a portion 1350a provided at the upper end thereof. For example, the extension 1342 may extend from the support member 1340 toward the display.

Since the display and printed circuit board 1360 are assembled in the vertical direction, the electrical connection structure between the support structure 1350 and the printed circuit board 1360 may be implemented as an electrical connection path in the vertical direction.

A first conductive structure provided in the support member 1340 according to an embodiment may extend to the extension 1342 and the second conductive structure provided in the support structure 1350 may be provided in the upper portion 1350*a* of the support structure. For example, the extension 1342 of the support member and the portion 1350*a* of the support structure are stacked in the vertical direction when the electronic device is assembled. Such a stacked state can provide an electrical connection path in a substantially vertical direction.

To this end, the upper portion 1350*a* of the metallic support structure may include a conductor 1351 and an insulator 1352 enclosing the conductor 1351. The conductor 1351 may be electrically connected to the first conductive structure provided in the support member 1340 and the printed circuit board 1360 using a connection terminal (not illustrated).

Figure 14:
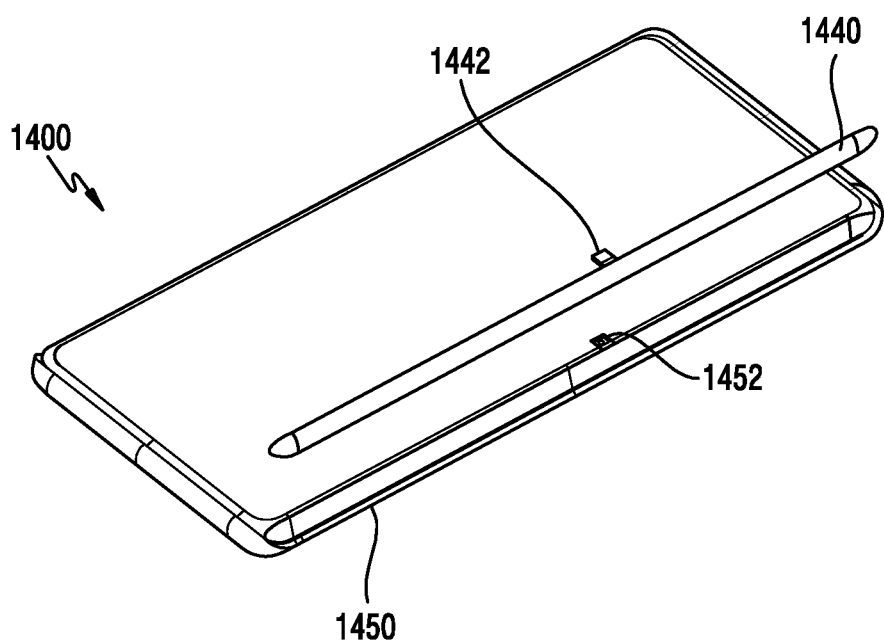
FIG. 14 is a perspective view illustrating a support member and a support structure according to an embodiment of the present disclosure.

Referring to FIG. 14, according to an embodiment, the electronic device 1400 may be an electronic device partly or entirely the same as the electronic device 500 illustrated in FIG. 5. According to an embodiment, in order to connect at least one antenna radiator mounted on a support member 1440 to a print circuit board, the support member 1440 may be directly connected to the support structure 1450.

According to an embodiment, the support member 1440 may have a protruding connection structure 1442. The connection structure 1442 may be integrally formed on the support member 1440, and may protrude in the horizontal direction (i.e. the transverse direction of the electronic device). The connection structure 1442 may be adapted to provide an electrical connection to another component.

According to an embodiment, the support structure 1450 may have a connection groove 1452 such that the connection structure 1442 is inserted into the connection groove 1452. The connection groove 1452 may be provided with at least one connection portion, such that when the support member 1440 is coupled to the support structure 1450, the connection structure 1442 is inserted into the connection groove 1452 to form an electrical path. The antenna radiator formed on the support member 1440 may then be electrically connected to the printed circuit board. The first conductive structure provided in the support member 1440 may be configured at least partially or entirely the same as the first conductive structure illustrated in FIGS. 8A to 8C. The second conductive structure provided in the support structure 1450 may be at least partially or entirely the same as the second conductive structure illustrated in FIGS. 9A to 9C.

Figure 15A:
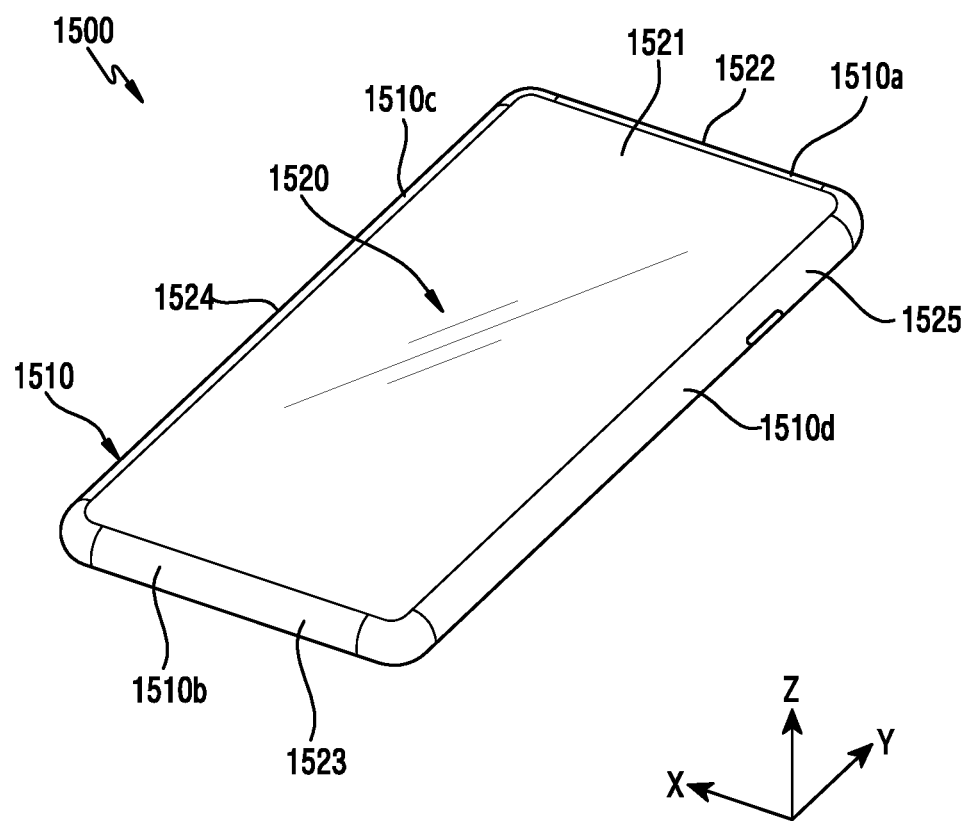
FIG. 15A is a perspective view illustrating the front side of another electronic device according to an embodiment of the present disclosure, and FIG. 15B(a), FIG. 15B(b), FIG. 15B(c), FIG. 15B(d) and FIG. 15B(e) respectively illustrate a front view, a rear view, a top view, a bottom view, and a left side view of the electronic device.
Figure 15B:
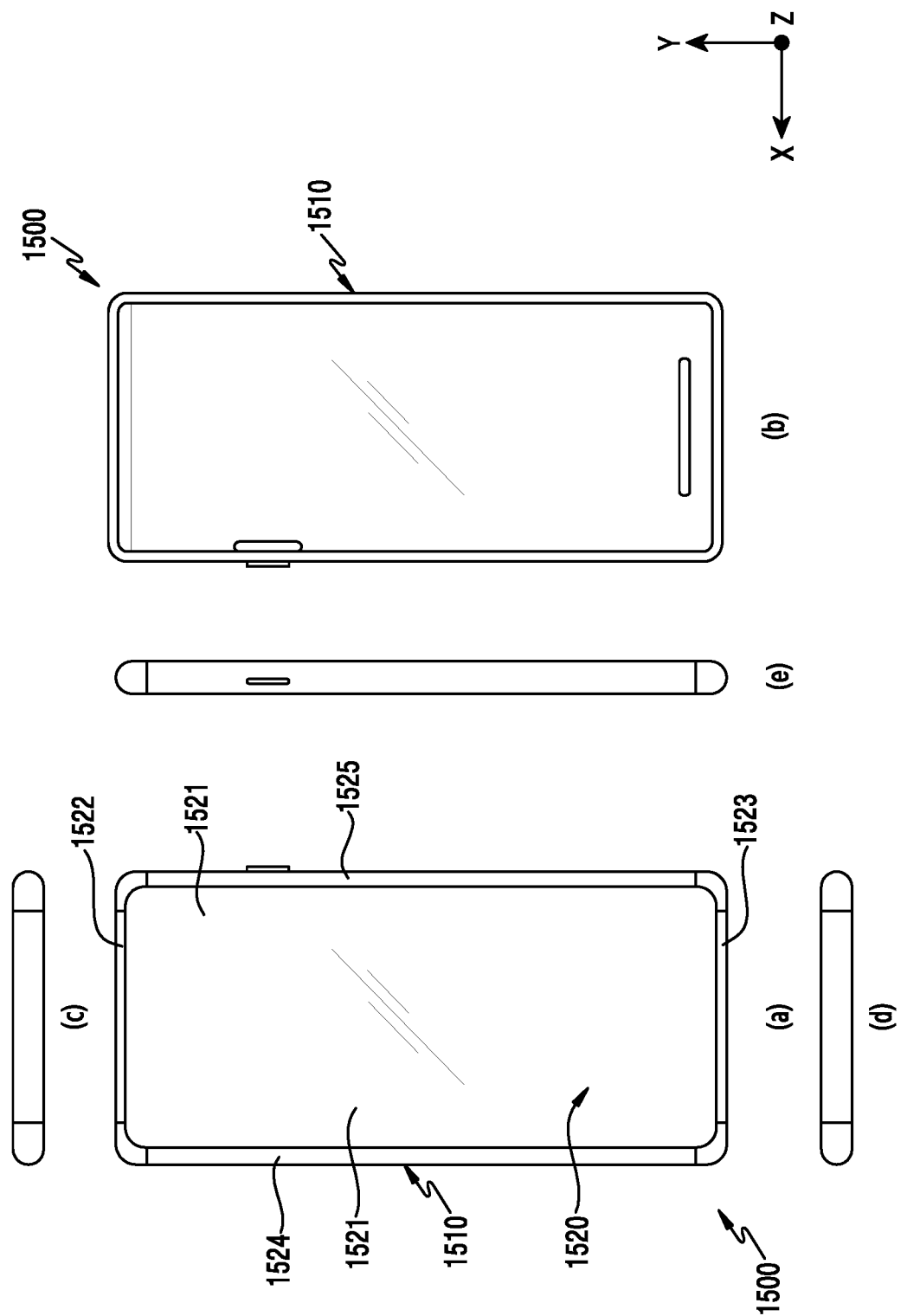

Referring to FIGS. 15A and 15B, since an electronic device 1500 according to the shown embodiment differs from the electronic device 100 illustrated in FIGS. 1A and 1B only in the configurations of the upper edge and the lower edge of the housing, descriptions of similar components will be omitted.

In addition, the antenna radiator illustrated in FIGS. 3 to 14 and the electrical connection path of the antenna radiator can also be equally applied to the electronic device 1500.

The electronic device 1500 according to an embodiment may differ from other disclosed embodiments in that the electronic device 1500 may include third and fourth curved displays 1522 and 1523, which are configured in the upper edge 1510*a* and the lower edge 1510*b* of the housing 1510, respectively.

According to an embodiment, the housing 1510 may include a plurality of side faces. For example, the side faces may include a side face on the upper edge 1510*a* of the housing 1510, a side face on the lower edge 1510*b* of the housing 1510, a side face on the left edge 1510*c* of the housing, and a side face on the right edge 1510*d* of the housing.

The electronic device 1500 according to an embodiment may include a display 1520. According to an embodiment, the display 1520 may include a flat display 1521 and first to fourth curved displays 1522 to 1525 disposed on the respective edges 1510*a* to 1510*d* of the flat display 1521. The first to fourth curved displays 1522 to 1525 may be disposed in the peripheral portions of the flat display 1521, i.e. the respective edges.

According to an embodiment, the first to fourth curved displays 1522 to 1525 may have first to fourth curvatures, respectively. The first to fourth curvatures may be equal to or different from each other.

The electronic device 150 according to an embodiment may be configured such that at least one antenna radiator can be mounted on a support member (see FIGS. 3 and 4) disposed on each of the upper, lower, left and right edges 1510*a* to 1510*d*. Doing so may be advantageous because the electronic device can be made slimmer.

Figure 16A:
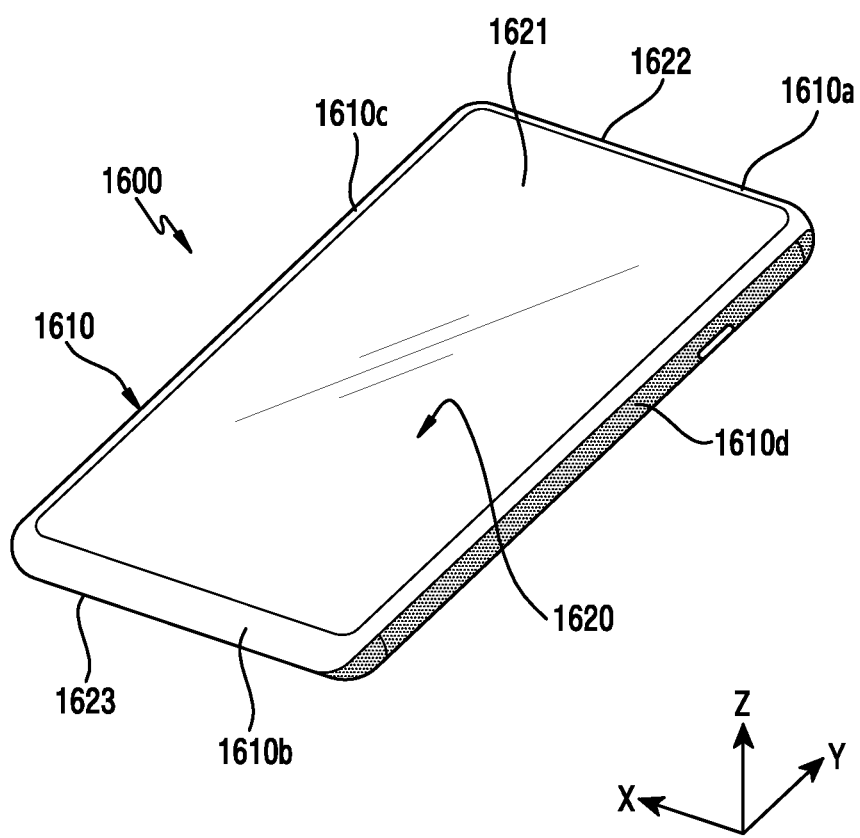
FIG. 16A is a perspective view illustrating the front side of still another electronic device according to an embodiment of the present disclosure, and FIG. 16B(a), FIG. 16B(b), FIG. 16B(c), FIG. 16B(d) and FIG. 16B(e) respectively illustrate a front view, a rear view, a top view, a bottom view, and a left side view of the electronic device.
Figure 16B:
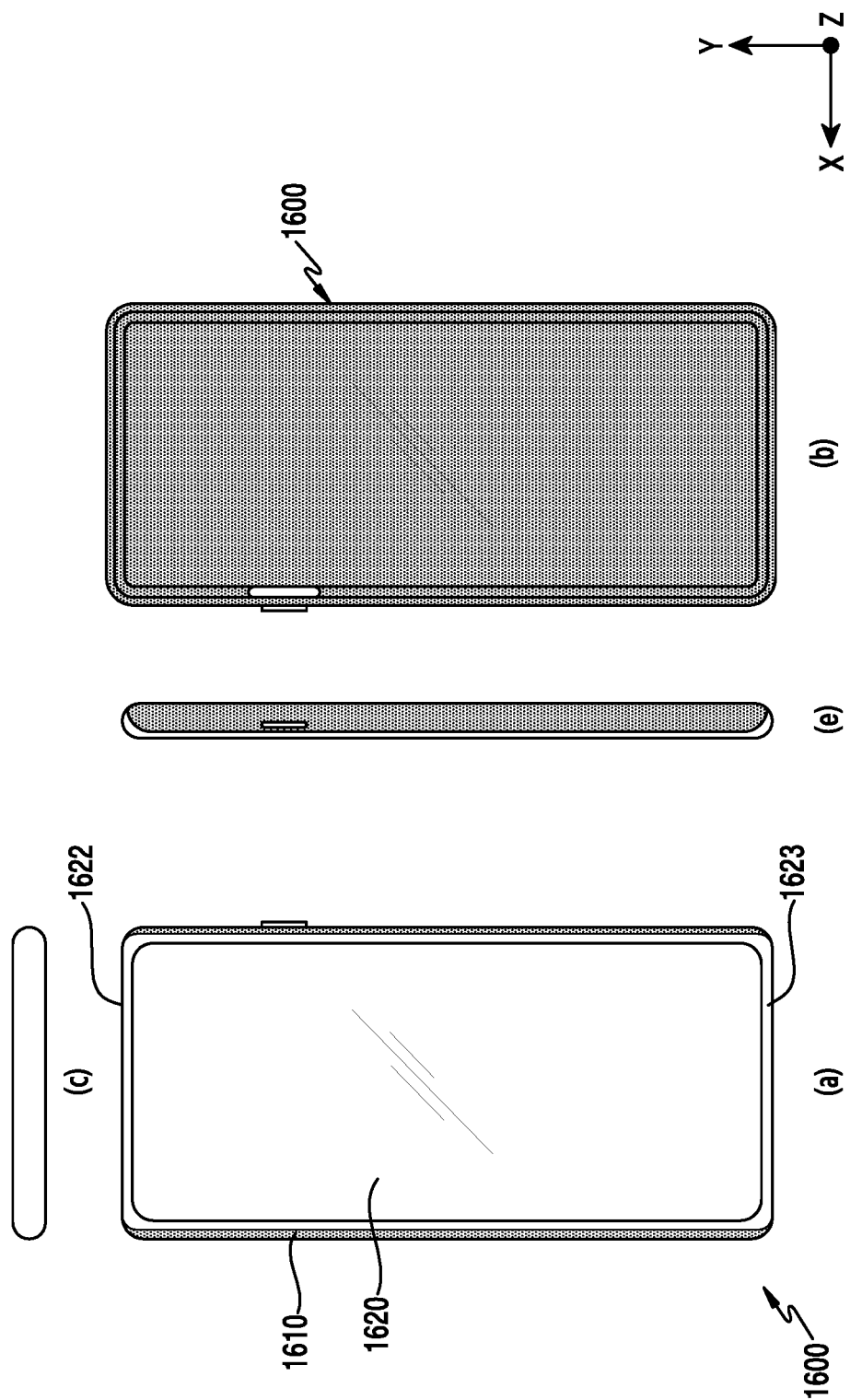

Referring to FIGS. 16A and 16B, an electronic device 1600 according to the shown embodiment differs from the electronic device 100 illustrated in FIGS. 1A and 1B only in the arrangement position of the curved displays in the housing, descriptions of similar components will be omitted.

In addition, the antenna radiator illustrated in FIGS. 3 to 14 and the electrical connection path of the antenna radiator can also be equally applied to the electronic device 1600.

The electronic device 1600 according to an embodiment may differ from other embodiments in that the electronic device 1600 may include first and second curved displays 1622 and 1623, which are configured in the upper edge 1610*a* and the bottom edge 1610*b* of the housing 1610, respectively, and the left edge 1610*c* and the right edge 1610*d* may be part of the housing 1610 and not include curved displays. That is, the first and second curved displays 1622 and 1623 may be disposed in the upper and lower edges of the display 1620, respectively.

The electronic device 1600 according to an embodiment may be configured such that at least one antenna radiator can be mounted on a support member (see FIGS. 3 and 4) disposed on each of the upper and lower edges 1610*a* and 1610*b*. Doing so may be advantageous because the electronic device can be made slimmer.

Figure 17:
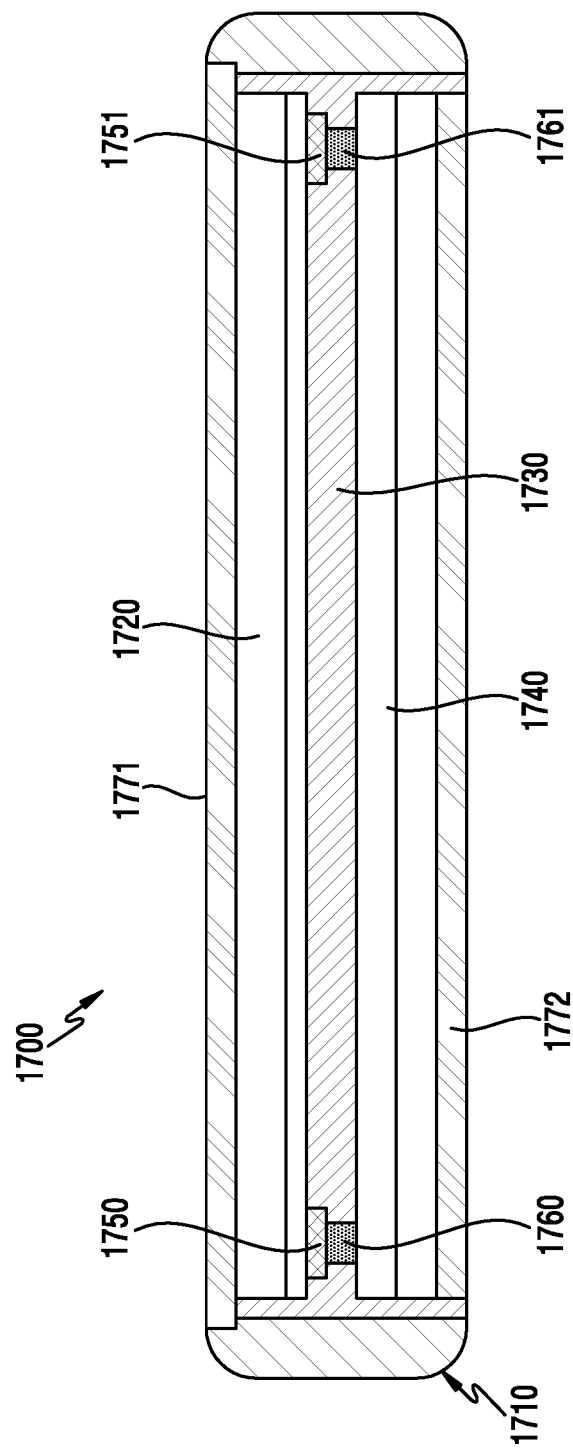
FIG. 17 is a sectional view illustrating the internal configuration of an electronic device in which a support member is provided with an antenna radiator according to an embodiment of the present disclosure.

Referring to FIG. 17, an electronic device 1700 according to an embodiment may include support members 1750 and 1751, on which antenna radiators are formed and which may be applied to a flat display 1720.

The electronic device 1700 according to an embodiment may include a housing 1710, a flat display 1720 that is disposed to be exposed on the first face of the housing 1710, a support structure 1730, support members 1750 and 1751, antenna radiators (see FIG. 5), a printed circuit board 1740, and conductive structures 1760 and 1761.

According to an embodiment, the support structure 1730 may support the flat display 1720 on one face in the first direction ① and a printed circuit board 1740 on a second face in the second direction ②.

According to an embodiment, the support members 1750 and 1751 may be mounted in respective mounting grooves formed in the support structure 1730. As illustrated in FIG. 5 and FIGS. 6A to 6D, each of the support members 1750 and 1751 may have at least one antenna radiator, which may be formed on either or both of the upper face in the first direction ① and the lower face in the second direction ②. Since the configuration in which the antenna radiators are mounted on the support members 1750 and 1751 has already been described (see FIG. 5), their detailed description is omitted.

According to an embodiment, each of the support members 1750 and 1751 may have an elongated shape and two opposite faces, and may be disposed under the display 1720 to be parallel to each other and to overlap the display 1720. According to an embodiment, one or more support members 1750 and 1751 may be disposed along at least one side face of the housing 1710. For example, the side face of the housing 1710 may be a side face located in the upper edge of the housing 1710, a side face located in the lower edge of the housing, a side face located in the left edge of the housing, and/or a side face located in the right edge of the housing.

In an embodiment, each of the support members 1750 and 1751 may be provided with a first conductive structure. The first conductive structure may be formed in any of the structures illustrated in FIGS. 8A to 8C. Each of the support members 1750 and 1751 and the printed circuit board 1740 may be electrically connected to each other by a second conductive structure.

According to an embodiment, the second conductive structure may provide a connection structure in the vertical direction. For example, the first and second conductors 1760 and 1761 may disposed in the support structure 1730 using insert injection molding such that each of the antenna radiators, which are provided on the respective support members 1750 and 1751, is electrically connected to the printed circuit board 1740.

The conductive structure of such an electronic device may be configured such that a conductive structure of an antenna radiator, which is an electrical connection path, can be disposed in the vertical direction when the display 1720 and the printed circuit board 1740 are assembled to the support structure 1730 in the vertical direction.

Embodiments disclosed in the present disclosure are suggested for easy explanation and understanding of the technical features disclosed herein and are not intended to limit the scope of various embodiments of the present disclosure. Therefore, the scope of various embodiments of the present disclosure should be interpreted as including all modifications, equivalents, and/or alternatives that are within the scope of the appended claims

What is claimed is:

1. An electronic device comprising:
    a housing including a first face facing in a first direction, a second face facing in a second direction opposite the first direction, and a side face facing in a third direction that is perpendicular to both the first and second directions and surrounding at least a part of a space between the first and second faces;
    a display including a first region disposed in at least a part of the first face and at least one second region extending from the first region, the at least one second region disposed in at least a part of the side face of the housing;
    a support member disposed in a partial region of the space along the side face and configured to support the at least one second region;
    a bracket disposed on another partial region of the space and configured to support the display; and
    at least one antenna radiator disposed on the support member,
    wherein the support member comprises:
        an outer face that faces the at least one second region; and
        an inner face that faces the bracket, and
    wherein the at least one antenna radiator is mounted on the outer face.

2. The electronic device of claim 1, wherein the display comprises a flat display in the first region and at least one curved display in the at least one second region, the at least one curved display being disposed in an edge region of the flat display.

3. The electronic device of claim 2, wherein the at least one curved display comprises:
    first and second curved displays located at opposite side edges of the flat display, respectively, and
    the first and second curved displays are symmetrically disposed about the flat display.

4. The electronic device of claim 1, further comprising:
    a transparent member disposed on the display in the first direction,
    wherein the outer face comprises a first outer face that faces the second region, and a second outer face that faces the transparent member.

5. The electronic device of claim 1, wherein the at least one antenna radiator is arranged in a longitudinal direction of the support member.

6. The electronic device of claim 1, further comprising:
    a printed circuit board; and
    at least one electrical connection path electrically connecting the antenna radiator and the printed circuit board.

7. The electronic device of claim 6, wherein the electric connection path comprises:
    at least one first conductive structure mounted on the support member, the first conductive structure being electrically connected to the antenna radiator;
    at least one second conductive structure mounted on the bracket;
    a third conductive structure connecting the first and second conductive structures; and
    a fourth conductive structure mounted on the printed circuit board and connected to the second conductive structure.

8. The electronic device of claim 7, wherein the first conductive structure comprises at least one first connection portion extending in a fourth direction opposite the third direction,
    the second conductive structure comprises at least one second connection portion mounted in the bracket and extending in the fourth direction,
    the third conductive structure comprises at least one first connection terminal configured to electrically connect the first connection portion and the second connection portion, and
    the fourth conductive structure comprises at least one second connection terminal electrically connected to the second conductive structure.

9. The electronic device of claim 8, wherein the second connection portion comprises:
    at least one conductor disposed in the bracket; and
    at least one insulator enclosing the at least one conductor.

10. The electronic device of claim 1, further comprising:
a transparent member disposed on the display in the first direction, wherein the at least one second region has a curvature and extends to a first rotation angle of at least 90 degrees about a center of the curvature, the transparent member has a curvature and extends to a second rotation angle of at least 90 degrees or more about the center of the curvature, and wherein the second rotation angle is equal to or larger than the first rotation angle.

11. The electronic device of claim 1, wherein the antenna radiator is printed on the support member as an antenna pattern.

12. An electronic device comprising:
a display extending from one face of the electronic device to another face of the electronic device, wherein a portion of the display in the another face of the electronic device is curved;
a support member disposed on at least a part of the another face so as to support the portion of the display in the another face; and
a conductive member formed on an outer face of the support member that faces at least the part of another face, and configured to receive a radio signal.

13. The electronic device of claim 12, further comprising:
a contact portion electrically connected to the conductive member and configured to be electrically connected to a printed circuit board of the electronic device.

14. The electronic device of claim 13, further comprising:
a bracket configured to be a substrate where the display and the printed circuit board are mounted thereon,
wherein the bracket includes a connection member disposed between and electrically connected to the contact portion and the printed circuit board.

15. The electronic device of claim 12, further comprising:
a bracket configured to be a substrate where the display is mounted thereon, wherein the bracket includes a groove portion configured to receive the support member.

16. The electronic device of claim 12, further comprising:
a bracket configured to be a substrate where the display is mounted thereon,
wherein the outer face of the support member faces the display, and the support member comprises an inner face that faces the bracket, the conductive member being disposed on at least a part of the outer face.

17. The electronic device of claim 16, further comprising:
a transparent member disposed on a face of the display,
wherein the outer face comprises a first outer face that faces the display, and a second outer face that faces the transparent member.

18. The electronic device of claim 12, wherein the conductive member is arranged in a longitudinal direction of the support member.

19. The electronic device of claim 12, further comprising:
a transparent member disposed on a face of the display,
the portion of the display in the another face has a curvature and extends to a first rotation angle of at least 90 degrees or more about a center of the curvature, and
the transparent member has a curvature and extends to a second rotation angle of at least 90 degrees or more about the center of the curvature, wherein the second rotation angle is equal to or larger than the first rotation angle.

* * * * *